US008369477B2

(12) United States Patent
Shibayama

(10) Patent No.: US 8,369,477 B2
(45) Date of Patent: Feb. 5, 2013

(54) CLOCK FREQUENCY DIVIDER CIRCUIT AND CLOCK FREQUENCY DIVISION METHOD

(75) Inventor: Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 13/129,345

(22) PCT Filed: Dec. 2, 2009

(86) PCT No.: PCT/JP2009/006557
§ 371 (c)(1),
(2), (4) Date: May 13, 2011

(87) PCT Pub. No.: WO2010/070830
PCT Pub. Date: Jun. 24, 2010

(65) Prior Publication Data
US 2011/0222644 A1    Sep. 15, 2011

(30) Foreign Application Priority Data

Dec. 17, 2008  (JP) ................................. 2008-321129

(51) Int. Cl.
*H03K 21/00* (2006.01)
*H03K 23/00* (2006.01)

(52) U.S. Cl. ........................................... 377/47; 377/48
(58) Field of Classification Search ........................ None
See application file for complete search history.

(56) References Cited

U.S. PATENT DOCUMENTS

| 5,365,119 A * | 11/1994 | Kivari ............................ 327/115 |
| 6,157,694 A * | 12/2000 | Larsson ........................... 377/48 |
| 6,459,753 B2 * | 10/2002 | Verlinden ........................ 377/48 |
| 6,834,094 B1 * | 12/2004 | Liu et al. ........................ 377/47 |
| 7,881,422 B1 * | 2/2011 | Chiang ........................... 377/47 |
| 2002/0121938 A1 * | 9/2002 | Fan ................................. 331/16 |
| 2011/0187418 A1 * | 8/2011 | Shibayama .................... 327/115 |
| 2012/0098583 A1 * | 4/2012 | Shibayama .................... 327/276 |

FOREIGN PATENT DOCUMENTS

| JP | 63-7016 A | 1/1988 |
| JP | 63-82015 A | 4/1988 |
| JP | 63-151217 A | 6/1988 |
| JP | 9-46222 A | 2/1997 |
| JP | 2005045507 A | 2/2005 |
| JP | 2006148807 A | 6/2006 |

OTHER PUBLICATIONS

International Search Report for PCT/JP2009/006557 mailed Dec. 28, 2009.

* cited by examiner

*Primary Examiner* — Tuan T Lam

(57) ABSTRACT

A clock frequency divider circuit in accordance with the present invention is capable of generating a clock signal that makes it possible to perform an expected proper communication operation in communication with a circuit operating by a clock having a different frequency, and includes a mask control circuit 20 and a mask circuit 10. The mask control circuit 20 includes a mask timing signal generation circuit 22 that generates a mask timing signal 29 used to preferentially mask a clock pulse at a timing other than communication timings among M clock pulses of the input clock signal based on a communication timing signal 26, and a mask restraint circuit 62 that carries out a process to restrain masking of a clock pulse at a communication timing. The mask circuit 10 generates an output clock signal by masking clock pulses of an input clock signal according to a mask signal 50 generated by the mask control circuit.

16 Claims, 18 Drawing Sheets

CLOCK FREQUENCY DIVIDER CIRCUIT AND CLOCK FREQUENCY DIVISION METHOD

This application is the National Phase of PCT/JP2009/006557, filed Dec. 2, 2009, which is based upon and claims the benefit of priority from Japanese patent application No. 2008-321129, filed on Dec. 17, 2008, the disclosure of which is incorporated herein in its entirety by reference.

TECHNICAL FIELD

The present invention relates to a clock frequency divider circuit and a clock frequency division method, in particular to a clock frequency divider circuit and a clock frequency division method in which the frequency of a clock signal is divided by a frequency division ratio of an arbitrary rational number.

BACKGROUND ART

In a clock frequency divider circuit that generates a clock signal having a lower frequency from an original clock signal having an arbitrary frequency by dividing the frequency of the original clock signal, it is easy to realize a divider circuit whose frequency division ratio, i.e., the ratio of the frequency of the generated clock signal to the frequency of the original clock signal is expressed as "1/M" (M is an integer) (integer frequency divider circuit) by using a counter circuit.

Further, divider circuits capable of performing a frequency division even when the frequency division ratio is a rational number expressed as "N/M" (N is a positive integer and M is a positive integer greater than N) (rational-number frequency divider circuit) have been also proposed (see Patent literatures 1 and 2). According to these related-art techniques, firstly, the value N of the numerator of the frequency division ratio is cumulatively added at each cycle of the input clock signal. Next, if the addition result becomes larger than the value M of the denominator of the frequency division ratio, the value M is subtracted from the cumulative addition result. By performing these operations, and then appropriately masking (thinning out) clock pulses of the input clock signal by referring to the cumulative addition result, the related-art technique realizes a rational-number frequency division.

A specific example of the problem that occurs in the above-described clock frequency divider circuit in the related art is explained with reference to FIGS. 17 and 18. FIG. 17 is an example of semiconductor integrated circuit using a clock frequency divider circuit in the related art. FIG. 18 shows the operation of the clock frequency divider circuit in the related art.

As shown in FIG. 17, a clock frequency divider circuit 200 in the related art generates a clock B by dividing the frequency of a clock S by a rational number based on input frequency division ratio setting. A circuit A (circuit at the other end) and a circuit B (target circuit) communicate with each other through signals Aout and Bout. The signal Aout is output by the circuit A at a timing of a clock A and is received by the circuit B at a timing of a clock B. The signal Bout is output by the circuit B at a timing of the clock B and is received by the circuit A at a timing of the clock A.

FIG. 18 shows clocks B that are generated by dividing the frequency of a clock S at frequency division ratios 11/12 to 4/12. The clocks B can be generated by appropriately masking clock pulses of the input clock S. For example, a clock B corresponding to the frequency division ratio 9/12 is generated by masking three clock pulses at timings T3, T8 and T11 among the twelve clock pulses at the timings T0 to T11 of the clock S.

In this example, assume that the frequency of the clock A is one third of that of the clock S. That is, the frequency division ratio of the clock A to the clock S is 1/3 (=4/12). Note that the phase relation between the clock A and the clocks B makes a full circle in twelve cycles of the clock S. The timings of the twelve cycles, in which the phase relation makes a full circle, are represented by "T0" to "T11".

Assume also that the circuit A and the circuit B communicate with each other at the timings T0, T3, T6 and T9, which correspond to all the rising edge timings of the clock A. That is, the circuit A outputs the signal Aout and receives the signal Bout at the timings T0, T3, T6 and T9, which are the rising edge timings of the clock A and are the communication timings.

However, the above-described clock frequency divider circuit in the related art does not give any consideration to the communication with circuits using clocks having different frequencies. Therefore, the clock frequency divider circuit in the related art could generate the clock B by masking clock pulses of the clock S at these communication timings. In the case of example shown in FIG. 18, the clock frequency divider circuit generates some of the clocks B by masking a clock pulse of the clock S at the timing T3, T6 and/or T9 among the communication timings.

Specifically, at the timing T3, the clock pulse is masked for the frequency division ratios 9/12 (91), 6/12 (92), and 5/12 (93). Similarly, at the timing T6, the clock pulse is masked for the frequency division ratio 5/12 (94). Similarly, at the timing T9, the clock pulse is masked for the frequency division ratios 7/12 (95), 6/12 (96), and 5/12 (97).

CITATION LIST

Patent Literature

Patent literature 1: Japanese Unexamined Patent Application Publication No. 2005-45507
Patent literature 2: Japanese Unexamined Patent Application Publication No. 2006-148807

SUMMARY OF INVENTION

Technical Problem

If the clock pulse of the clock S is masked at the communication timing to generate the clock B as in the case of the above-described example, the circuit B operating by the clock B cannot receive a signal output to the signal Aout by the circuit A operating by the clock A at an expected timing. Similarly, the circuit B operating by the clock B cannot output a signal to the signal Bout at the timing that is expected by the circuit A operating by the clock A.

Therefore, in the above-described clock frequency divider circuit in the related art, communication with a circuit operating by a clock having a different frequency requires a special clock transfer circuit and/or special timing design to realize an expected proper communication operation. As a result, there are problems that the communication performance deteriorates, and that the power consumption, circuit size, and design cost increase.

The present invention has been made in view of the above-described problems, and an object thereof is to provide a clock frequency divider circuit that generates a clock signal that makes it possible to perform an expected proper communication operation in communication with a circuit operating by a clock having a different frequency, and a clock frequency division method.

Solution to Problem

A clock frequency divider circuit in accordance with the present invention is a clock frequency divider circuit that generates an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, the clock frequency divider circuit including: a mask control circuit including: a mask timing signal generation circuit that generates a mask timing signal used to preferentially masks a clock pulse at a timing other than a communication timing of data communication performed by a target circuit using the output clock signal among M clock pulses of the input clock signal based on a communication timing signal indicating the communication timing; and a mask restraint circuit that generates a mask signal obtained by processing the mask timing signal so that masking of the clock pulse is restrained at the communication timing; and a mask circuit that generates the output clock signal by masking a clock pulse of the input clock signal according to the mask signal generated by the mask control circuit.

A clock frequency divider circuit in accordance with the present invention is a clock frequency divider circuit that generates an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, the clock frequency divider circuit including: a counter that generates a count value indicating a relative phase of a communication timing with respect to the input clock signal by counting a clock pulse of the input clock signal and resetting a count value when the count value reaches a denominator M of the frequency division ratio; a mask control circuit including: a mask timing signal generation circuit that generates a mask timing signal used to preferentially masks a clock pulse at a timing other than a communication timing of data communication performed by a target circuit using the output clock signal among M clock pulses of the input clock signal based on the count value and a communication timing signal indicating the communication timing; and an error detection circuit that determines whether or not the count value is a normal value for the communication timing, and when the count value is determined to be not a normal value, controls the counter so as to reset the count value; and a mask circuit that generates the output clock signal by masking a clock pulse of the input clock signal according to the mask timing signal generated by the mask control circuit.

A clock frequency division method in accordance with the present invention is a clock frequency division method for generating an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, the clock frequency division method including: generating a mask timing signal used to preferentially masks a clock pulse at a timing other than a communication timing of data communication performed by a target circuit using the output clock signal among M clock pulses of the input clock signal based on a communication timing signal indicating the communication timing; generating a mask signal obtained by processing the mask timing signal so that masking of the clock pulse is restrained at the communication timing; and generating the output clock signal by masking a clock pulse of the input clock signal according to the mask signal.

A clock frequency division method in accordance with the present invention is a clock frequency division method for generating an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, the clock frequency division method including: generating a count value indicating a relative phase of a communication timing with respect to the input clock signal by counting a clock pulse of the input clock signal and resetting a count value when the count value reaches a denominator M of the frequency division ratio; generating a mask timing signal used to preferentially masks a clock pulse at a timing other than a communication timing of data communication performed by a target circuit using the output clock signal among M clock pulses of the input clock signal based on the count value and a communication timing signal indicating the communication timing; determining whether or not the count value is a normal value for the communication timing, and when the count value is determined to be not a normal value, controlling the counter so as to reset the count value; and generating the output clock signal by masking a clock pulse of the input clock signal according to the mask timing signal.

Advantageous Effects of Invention

In accordance with the present invention, it is possible to provide a clock frequency divider circuit that generates a clock signal that makes it possible to perform an expected proper communication operation in communication with a circuit operating by a clock having a different frequency, and a clock frequency division method.

DESCRIPTION OF EMBODIMENTS

First Exemplary Embodiment

A first exemplary embodiment in accordance with the present invention is explained hereinafter with reference to the drawings.

Figure 1:
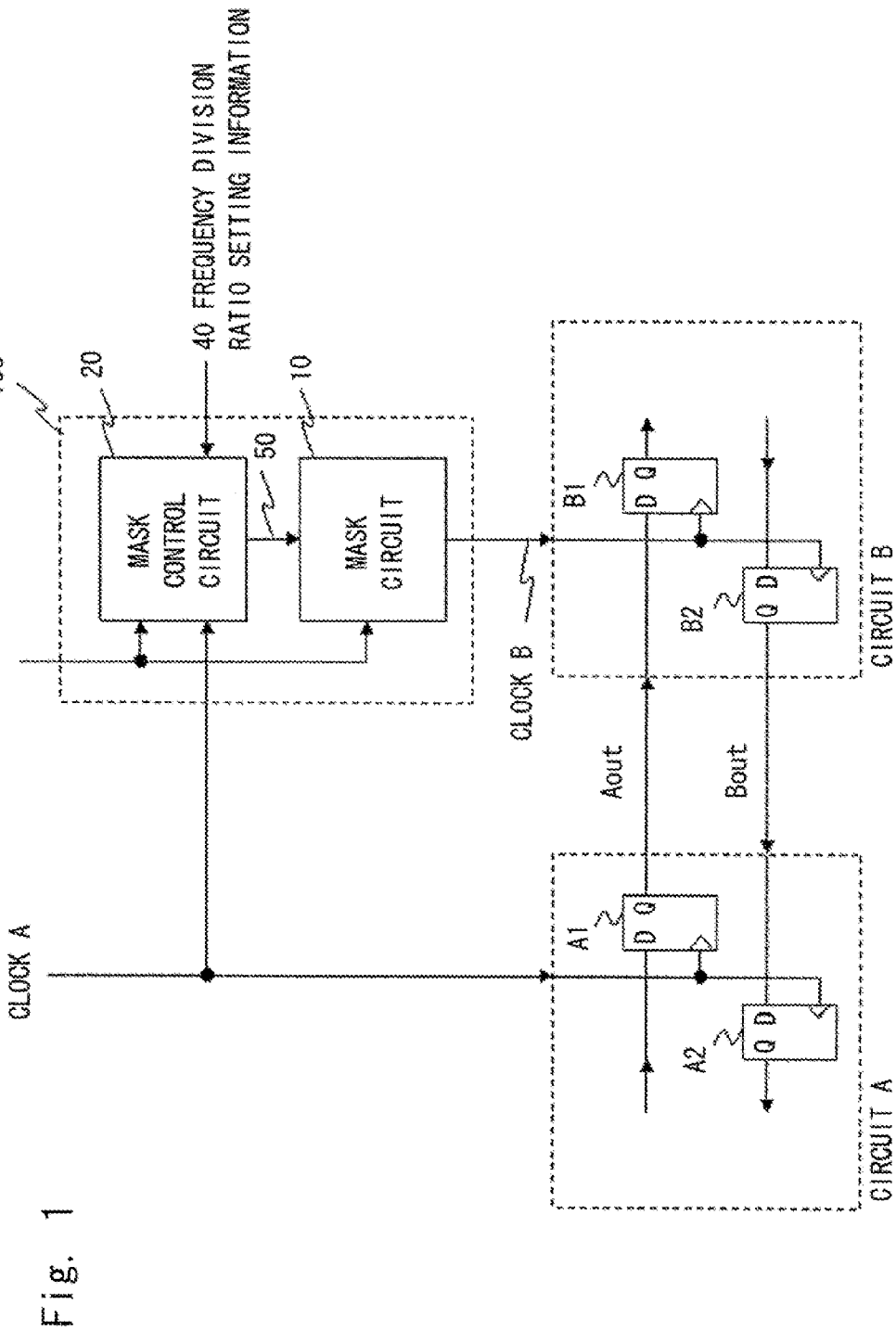
FIG. 1 is a block diagram showing a configuration of a clock frequency divider circuit in accordance with a first exemplary embodiment.

FIG. 1 is a block diagram showing a configuration of a clock frequency divider circuit in accordance with a first exemplary embodiment of the present invention. FIG. 1 shows an example of a semiconductor integrated circuit including a circuit A operating by a clock A (circuit at the other end) and a circuit B operating by a clock B (target circuit). Further, a clock frequency divider circuit 100 in accordance with this exemplary embodiment is provided in the circuit B.

The clock frequency divider circuit 100 is a circuit that generate a clock B (output clock signal) that is obtained by performing a rational-number frequency division on a clock S (input clock signal) at a frequency division ratio N/M (N is a positive integer and M is a positive integer greater than N) by masking (M-N) clock pulses among consecutive M clock pulses of the clock S based on a frequency division ratio defined as N/M of frequency division ratio setting information 40.

This clock frequency divider circuit 100 includes, as principle circuits, a mask circuit 10 and a mask control circuit 20. The mask circuit 10 has a function of masking clock pulses of the clock S according to an input mask signal 50, and thereby generating and outputting a clock B.

The mask control circuit 20 has a function of generating a mask signal 50 based on the communication timing of data communication between the circuit B using the clock B and the circuit A using the clock A, and outputting the generated mask signal 50 to the mask circuit 10. Note that the mask signal 50 is a signal in which (M-N) mask timings at each of which a clock pulse is masked are assigned to timings other than the communication timings at which the data communication is performed among the consecutive M clock pulse timings of the clock S.

The circuits A and B communicate with each other at the rising edge timings of the clock A by using signals Aout and Bout. In this example, the circuit A outputs a signal Aout by driving a flip-flop circuit A1 with the clock A and the circuit B receives the signal Aout by driving a flip-flop circuit B1 with the clock B. Meanwhile, the circuit B outputs a signal Bout by driving a flip-flop circuit B2 with the clock B and the circuit A receives the signal Bout by driving a flip-flop circuit A2 with the clock A.

The clock frequency divider circuit 100 receives the clock A indicating the communication timing between the circuit B and the circuit A in addition to the frequency division ratio setting information 40, and generates the clock B by dividing the frequency of the clock S at a rational-numbers frequency division ratio N/M based on the clock A.

Assume that the clock S, the clock A, and the frequency division ratio setting information 40 are supplied from a circuit at a higher level (not shown).

Assume also that the distribution delays of the clocks A and B are designed by using a clock-tree synthesis technique or the like so that they become substantially equal to each other. By doing so, the phase of the clock A in the circuit A coincides with the phase of the clock B in the circuit B. That is, all of the clock A, the clock B, and the clock S are in synchronization with each other.

Figure 2:
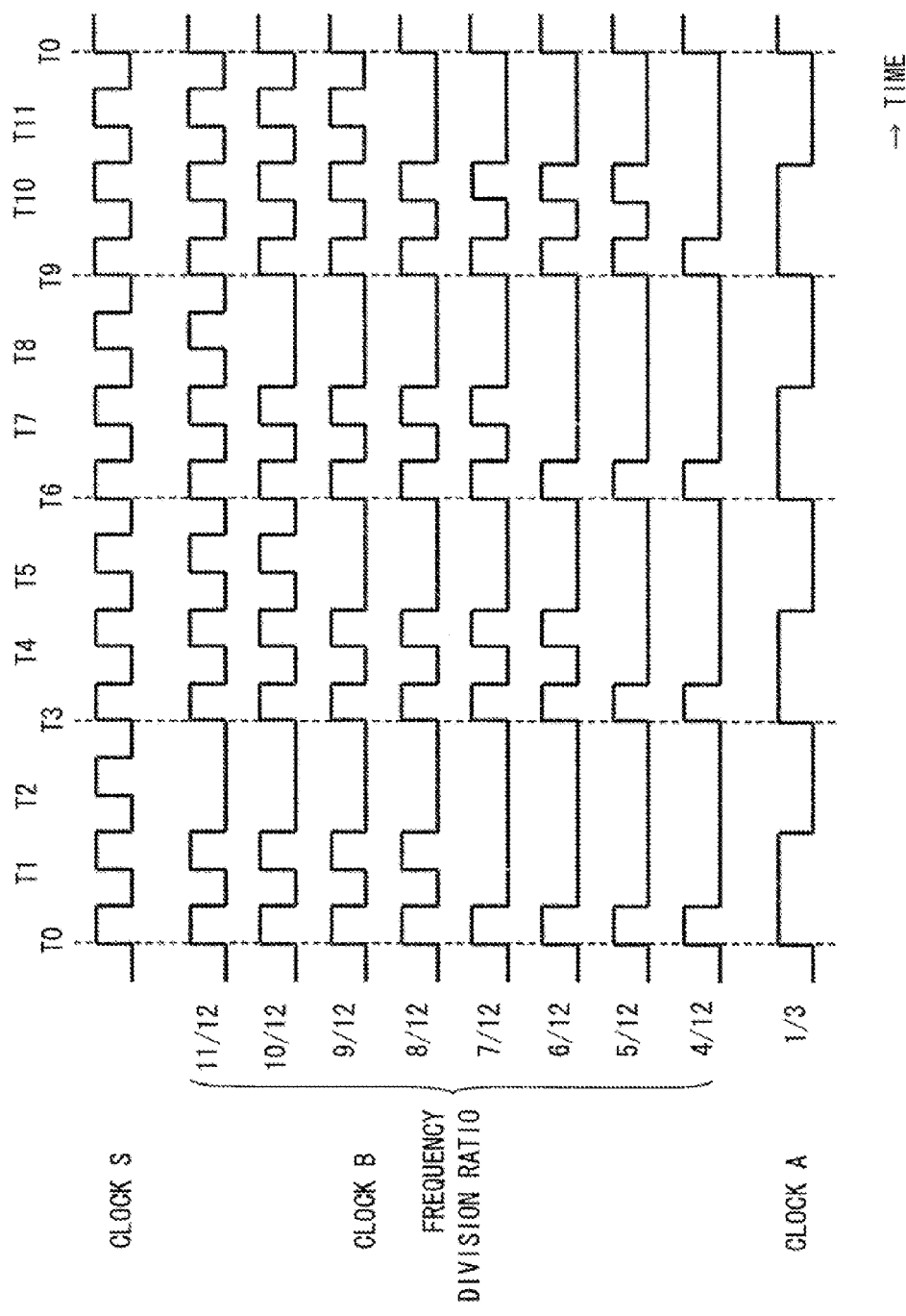
FIG. 2 is a timing chart showing an operation of a clock frequency divider circuit in accordance with a first exemplary embodiment.

Next, an operation of a clock frequency divider circuit in accordance with this exemplary embodiment is explained with reference to FIG. 2. FIG. 2 is a timing chart showing an operation of the clock frequency divider circuit in accordance with this exemplary embodiment. An example case where the frequency division ratio denominator M=12; the frequency division ratio numerator N=11 to 4; and the clock B is generated by dividing the frequency of the clock S at 11/12 to 4/12 is explained hereinafter.

The clock S, the clock A, and the frequency division ratio setting information 40 are input to the clock frequency divider circuit 100. The frequency division ratio setting information 40 is a signal indicating a frequency division ratio N/M of the clock B to the clock S, and a frequency division ratio C/M of the clock A to the clock S.

The clock S is a signal composed of successive clock pulses having a predetermined frequency. The clock A indicates communication timings between the circuit B and the circuit A. The frequency division ratio setting information 40 is composed of parallel data consisting of several bits indicating the values of the frequency division ratio denominator M, the frequency division ratio numerator N, and the frequency division ratio numerator C, and the values of the frequency division ratio setting information 40 do not change as long as the frequency division ratio is unchanged.

The mask control circuit 20 of the clock frequency divider circuit 100 outputs a mask signal 50 to the mask circuit 10. In the mask signal 50, (M-N) mask timings at each of which a clock pulse is masked are assigned to timings other than the communication timings at which the data communication is performed between the circuits B and A based on the communication timing indicated by the clock A and the frequency division ratio setting information 40.

Note that in the case where data communication is performed at the rising edge timings of the clock A as described above, the mask control circuit 20 assigns the mask timings, at each of which a clock pulse of the clock S is masked, to timings other than these communication timings, i.e., other than the rising edge timings of the clock A.

FIG. 2 shows a case where the frequency of the clock A is one third of that of the clock S, i.e., the frequency division ratio of the clock A to the clock S is 1/3 (=4/12), and the clock A and the clock B are in synchronization with each other. In this case, the phase relation between the clock A and the clock B makes a full circle in twelve cycles of the clock S. In FIG. 2, the timings of the twelve cycles, in which the phase relation makes a full circle, are represented by "T0" to "T11". Therefore, the circuits A and B perform data communication at the timings T0, T3, T6 and T9, which correspond to the rising edge timings of the clock A.

The mask control circuit 20 generates a mask signal 50 in which (M-N) mask timings at each of which a clock pulse is masked are assigned to some of the rising edge timings of the clock S other than these communication timings, i.e., to some of the timings T1, T2, T4, T5, T7, T8, T10 and T11.

For example, a clock B corresponding to a frequency division ratio 11/12 can be generated by assigning a mask timing at a timing other than the timings T0, T3, T6 and T9 among the twelve clock pulses at timings T0 to T11 of the clock S, e.g., at a timing T2. Further, a clock B corresponding to a frequency division ratio 10/12 can be generated by additionally assigning a mask timing at a timing T8. Further, a clock B corresponding to a frequency division ratio 9/12 can be generated by additionally assigning a mask timing at a timing T5. Further, a clock B corresponding to a frequency division ratio 8/12 can be generated by additionally assigning a mask timing at a timing T11.

Further, a clock B corresponding to a frequency division ratio 7/12 can be generated by assigning mask timings at timings T1, T2, T5, T8 and T11 among the timings other than the timings T0, T3, T6, and T9. Further, a clock B corresponding to a frequency division ratio 6/12 can be generated by additionally assigning a mask timing at a timing T7. Further, a clock B corresponding to a frequency division ratio 5/12 can be generated by additionally assigning a mask timing at a timing T4. Further, a clock B corresponding to a frequency division ratio 4/12 can be generated by additionally assigning a mask timing at a timing T10.

As described above, in this exemplary embodiment, the mask signal 50 in which (M-N) mask timings at each of which a clock pulse is masked are assigned to timings other than the communication timings at which the data communication is performed between the circuit B (target circuit) and the circuit A (circuit at the other end) is generated by the mask control circuit 20 and output to the mask circuit 10. In this way, the clock B is generated by masking (M-N) clock pulses at timings of the clock S other than the communication timings at which the data communication is performed.

As a result, no clock pulse of the clock S is masked at the communication timings, and therefore a clock pulse is always output at the communication timings in the clock B. Accordingly, the circuit B can receive a signal output to the signal Aout by the circuit A at an expected timing. Similarly, the circuit B can output a signal to the signal Bout at a timing expected by the circuit A.

Therefore, according to a clock frequency divider circuit in accordance with this exemplary embodiment, it is possible to generate an output clock signal (clock B) that makes it possible to perform data communication even with a circuit at the other end (circuit A) operating by a clock having a different frequency (clock A) without deteriorating the communication performance.

Further, the need for a special clock transfer circuit and/or special timing design for communication with a circuit operating by a clock signal having a different frequency is eliminated, thus making it possible to perform a rational-number frequency division on a clock signal with a low power, a small size, and a low design cost.

Further, in this exemplary embodiment, the mask control circuit 20 assigns (M-N) mask timings at each of which a clock pulse is masked to timings other than the communication timings at which the data communication is performed in the circuit at the other end according to the frequency division ratio setting information 40. Therefore, for example, even when the frequency division ratio N/M is changed to any of the frequency division rations 11/12 to 4/12, it is possible to mask clock pulses of the clock S at timings other than the communication timings of the circuit B, i.e., other than the timings T0, T3, T6 and T9. Therefore, even when the frequency division ratio is changed, it is unnecessary to change the clock A or the communication timing of the circuit A, thus making it possible to cope with the change in the frequency division ratio in an extremely flexible manner.

Figure 3:
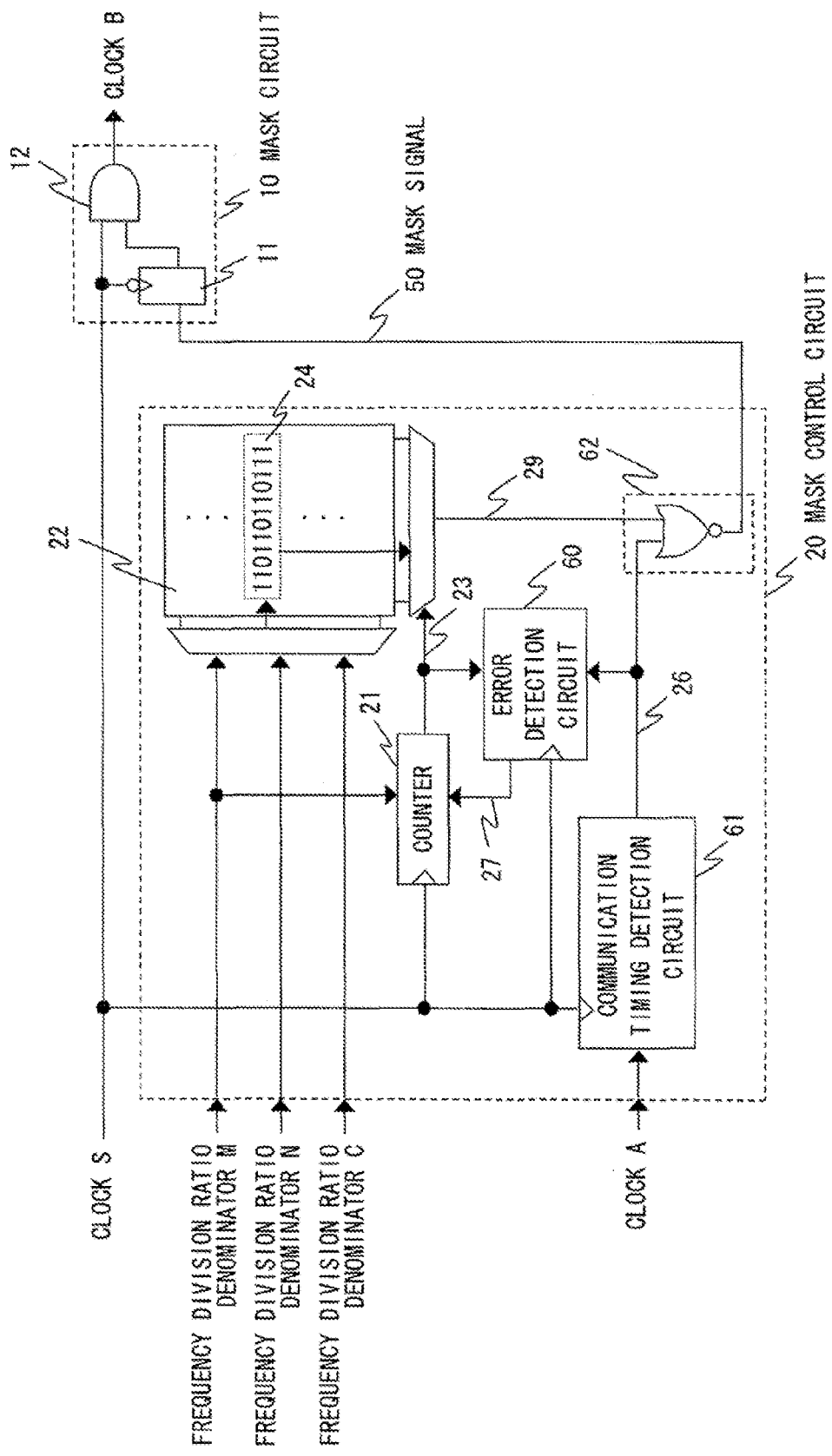
FIG. 3 is a block diagram showing a configuration of a clock frequency divider circuit in accordance with a first exemplary embodiment.

Next, the mask circuit 10 and the mask control circuit 20 of the clock frequency divider circuit 100 are explained in a more detailed manner with reference to FIG. 3.

FIG. 3 is a block diagram showing a configuration of a clock frequency divider circuit in accordance with this exemplary embodiment.

In FIG. 3, the mask circuit 10 has a function of selecting whether the pulse of the clock S is masked or is output in the clock B without being masked by referring to the input mask signal 50. In this exemplary embodiment, this mask circuit 10 includes a latch circuit 11 and a gate circuit 12.

The latch circuit 11 has a function of restricting the transition of the mask signal 50, which is input to the gate circuit 12, to the timings at which the value of the clock S is "0".

The gate circuit 12 has a function of masking the clock S based on the mask signal 50 latched by the latch circuit 11. When the value of the mask signal 50 is "0", the clock S is masked. When the value of the mask signal 50 is "1", the clock S is not masked.

The provision of the latch circuit 11 can prevent the occurrence of glitches in the clock B. Although the provision of the latch circuit 11 makes the timing design easier, the latch circuit 11 can be omitted if the occurrence of glitches is prevented by implementing precise timing design.

Further, although, an AND circuit is used as the gate circuit 12 to mask the clock S in FIG. 3, the present invention is not limited to this configuration. An OR circuit or other circuits having a similar function may be also used.

Further, the mask control circuit 20 generates a count value indicating a relative phase of a communication timing in the circuit B with respect to the clock S by counting clock pulses of the clock S based on the communication timing and the frequency division ratio setting information 40 Then, it also has a function of generating and outputting a mask signal 50 in which mask timings are assigned based on this count value.

In this exemplary embodiment, this mask control circuit 20 includes a counter 21, a table circuit 22, an error detection circuit 60, a communication timing detection circuit 61, and a mask restraint circuit 62. Further, the frequency division ratio setting information 40 is composed of parallel bit data consisting of a plurality of bits including a frequency division ratio denominator M, a frequency division ratio numerator N, and a frequency division ratio numerator C.

The counter 21 resets its count value to "0" at one of the communication timings. After that, the counter 21 counts clock pulses of the clock S, and when the count value 23 reaches the frequency division ratio denominator M, resets the count value to "0". In this way, it is possible to output the count value 23 from "0" to "M−1" indicating the relative phase of the communication timing of the circuit A with respect to the clock S. Therefore, the number of cycles in which the phase relation between the clocks A and B makes a full circle is output as the count value 23 from the counter 21.

The table circuit 22 has a function of holding table data 24 in a table format in advance. In the table data 24, the necessity/non-necessity of masking is indicated for each combination of the counter value 23, and the frequency division ratio denominator M, the frequency division ratio numerator N, and the frequency division ratio numerator C, i.e., the frequency division ratio setting information 40. Further, the table circuit 22 also has a function of outputting table data according to the combination of these input values as a mask, timing signal 29. In this way, the table circuit 22 outputs a mask timing signal 29 that is used to request the mask circuit 10 to mask the clock pulse of the clock S according to the frequency division ratio denominator M, the frequency division ratio numerator N, the frequency division ratio numerator C, and the count value 23 for each clock pulse of the clock S.

Note that the mask timing signal 29 is generated based on the communication timing referring to the count value 23, which is reset based on the communication timing signal. That is, the table circuit 22 generates a mask timing signal that is used to preferentially mask a clock pulse at a timing other than the communication timing among the clock pulses of the input clock signal.

The communication timing detection circuit 61 has a function of detecting a communication timing from the rising edge timing of the input clock A by referring to the clock A, and outputting the detect timing as a communication timing signal 26.

Figure 4:
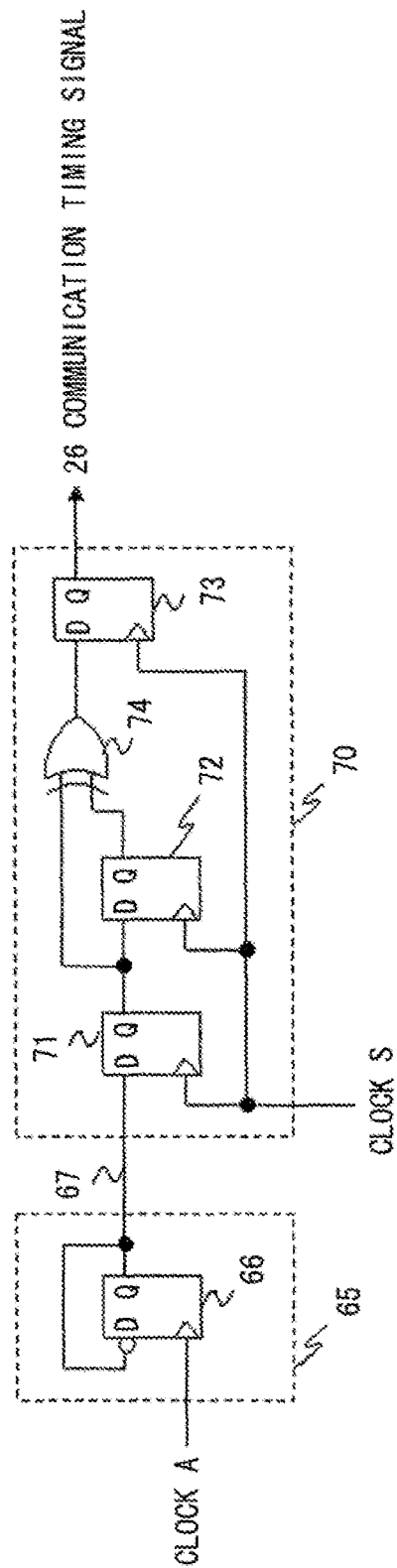
FIG. 4 is a block diagram showing a configuration of a communication timing detection circuit in accordance with a first exemplary embodiment.

FIG. 4 shows a specific example of the communication timing detection circuit 61. The communication timing detection circuit 61 includes a toggle circuit 65 and a toggle detection circuit 70.

The toggle circuit 65 operates by the clock A, and generates a toggle signal 67 whose value toggles at each rising edge timing of the clock A. The toggle detection circuit 70 receives the toggle signal 67 and detects its rising edge timing and falling edge timing, which are the toggle timings of the toggle signal 67. Next, it generates a communication timing signal 26 that becomes "1" at the rising edge timings of the clock A and becomes "0" at all the other timings. That is, when the communication timing signal 26 is "1", it indicates a communication timing. On the other hand, when the communication timing signal 26 is "0", it indicates a non-communication timing.

The error detection circuit 60 in FIG. 3 has a function of determining whether or not the count value is a normal value for the communication timing by referring to the count value 23 and the communication timing signal 26. Further, the error detection circuit 60 has a function of resetting the counter 21 by using a reset signal 27 when an error indicating that the count value 23 is not a normal value is detected.

Figure 5:
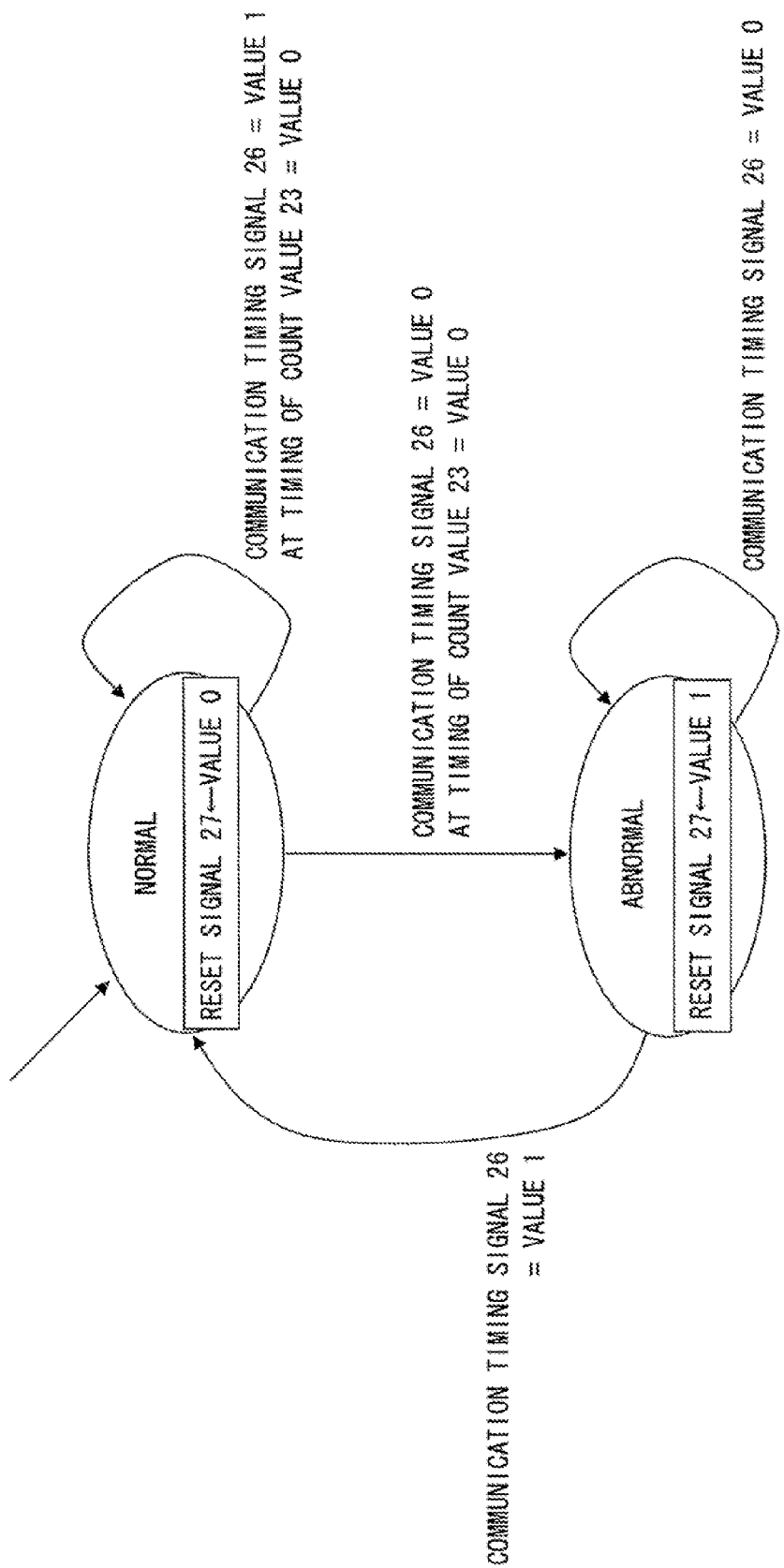
FIG. 5 is an operation transition diagram showing an operation of an error detection circuit in accordance with a first exemplary embodiment.

A specific example of an operation of the error detection circuit 60 is explained with reference to FIG. 5. FIG. 5 is an operation transition diagram showing an operation of the error detection circuit 60.

The error detection circuit 60 is a control circuit having two states consisting of "normal" and "abnormal". Specifically, firstly, in the "normal" state, the error detection circuit 60 determines whether or not the communication timing signal 26 is "1" indicating a communication timing at the timing at which the count value 23 becomes "0", which is the reset value of the counter 21, by referring to the input count value 23 and the communication timing signal 26.

If the communication timing signal 26 is "1" at the timing at which the count value 23 becomes "0", the error detection circuit 60 determines that the count value 23 indicates a normal value and remains in the "normal" state. In the "normal" state, "0" is output to the reset signal 27 so that the counter 21 is not reset, and therefore the counter 21 performs a normal count operation.

On the other hand, if the communication timing signal 26 is "0" at the timing at which the count value 23 becomes "0", the error detection circuit 60 determines that the count value 23 indicates an abnormal value and changes to an "abnormal" state. In the "abnormal" state, "1" is output to the reset signal 27 so that the counter 21 is reset, and therefore the counter 21 performs a reset operation. When it is not in the communication timing, i.e., when the communication timing signal 26 is "0", the error detection circuit 60 remains in the "abnormal" state.

On the other hand, when the communication timing signal 26 becomes "1" indicating a communication timing, the error detection circuit 60 changes to a "normal" state and the counter 21 restarts the normal count operation.

As explained above, the error detection circuit 60 determines whether the count value 23 is a normal value or not by determining whether or not the timing at which the count value 23 becomes the reset value of the counter 21 is simultaneous with the communication timing at which the counter 21 is to be reset.

Further, when the count value 23 is determined to be not a normal value, the counter 21 is reset at the timing at which the counter 21 is to be reset (communication timing). Therefore, even if the counter 21 malfunctions and the count value thereby indicates an abnormal value, it is autonomously detected and the counter 21 can be restored to the normal operation.

The mask restraint circuit 62 generates a mask signal 50 by referring to the mask timing signal 29 and the communication timing signal 26. In this process, at the communication timing, it generates a mask signal 50 that is used to control the mask circuit 10 in such a manner that the clock pulse is never masked regardless of the value of the mask timing signal 29. On the other hand, at the timings other than the communication timing, it generates a mask signal 50 that is used to control the necessity/non-necessity of masking according to the value of the mask timing signal 29.

Therefore, even if the counter 21 or the table circuit 22 malfunctions and the mask timing signal 29 thereby indicates an abnormal value, the clock pulse is not masked at least at the communication timing and therefore data communication can be properly performed between the circuits A and B.

As shown in FIG. 3, for example, the mask circuit 62 can be implemented by using a NOR gate circuit to which the mask timing signal 29 and the communication timing signal 26 are input.

Figure 6:
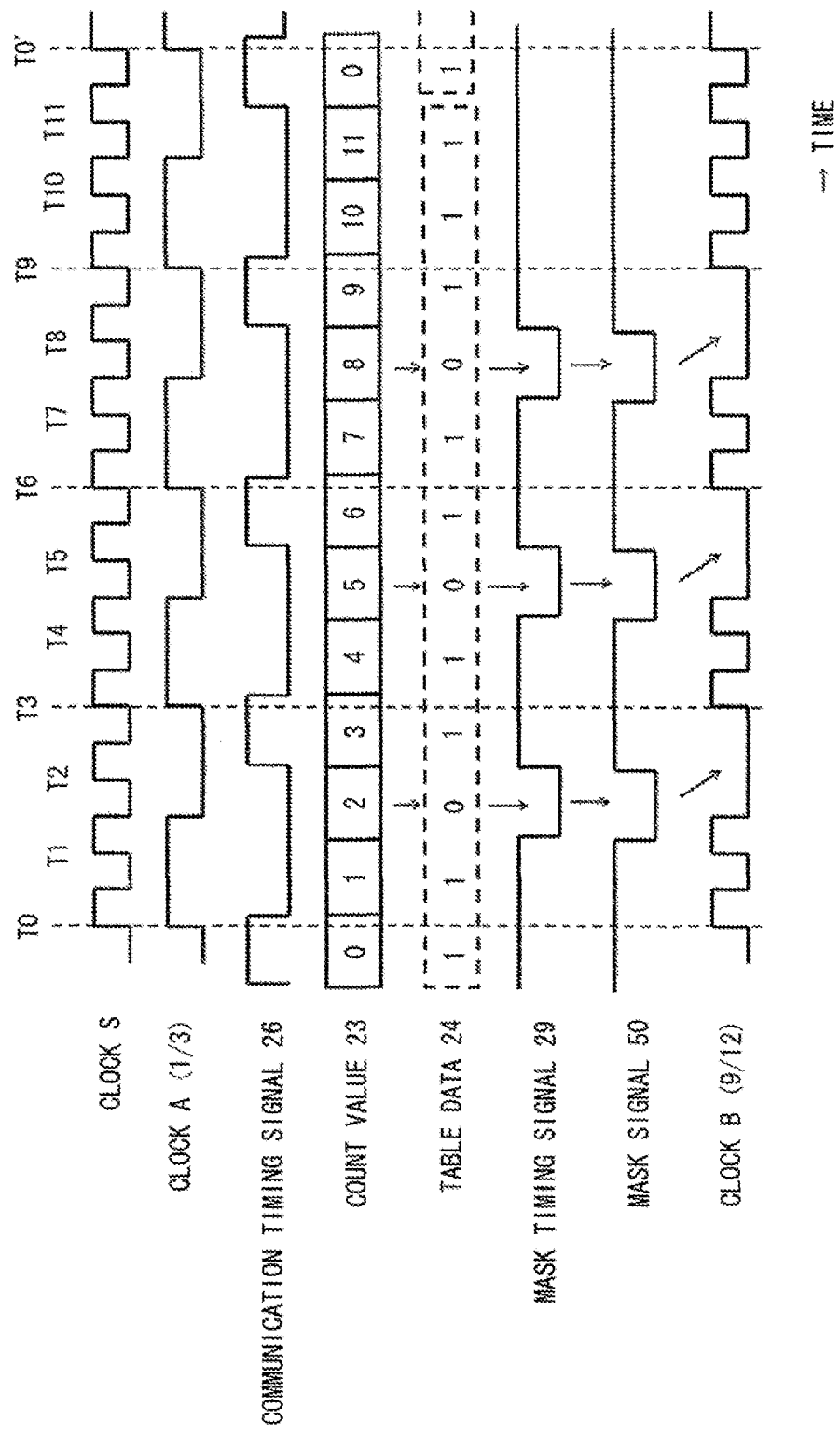
FIG. 6 is a timing chart showing an operation of a clock frequency divider circuit in accordance with a first exemplary embodiment.

Next, an operation of the clock frequency divider circuit in accordance with this exemplary embodiment in a normal state is explained with reference to FIG. 6. FIG. 6 is a timing chart showing an operation of the clock frequency divider circuit in accordance with this exemplary embodiment.

A case where a clock B corresponding to a frequency division ratio 9/12 is generated from a clock S is explained hereinafter. Assume that the circuit A and the circuit B perform data communication at all the rising edge timings of the clock A. Further, the clock A is in synchronization with the clock B and its frequency division ratio is one third (=4/12) of the clock B.

Note that since (frequency division ratio N/M of the clock B)=9/12 and (frequency division ratio C/M of the clock A)=4/

12, values "12", "9" and "4" are supplied as the frequency division ratio denominator M, the frequency division ratio numerator N, and the frequency division ratio numerator C, respectively, which constitute the frequency division ratio setting information 40.

The communication timing signal 26 becomes "1" at the rising edge timing of the clock A and becomes "0" at the other timings, and thereby indicates the communication timing between the circuits A and B.

The counter 21 becomes "0" at one of the communication timings. After that, the twelve cycles in which the phase relation between the clocks A and B makes a full circle is repeated and the clock pulses of the clock S is counted. In this way, a counter value 23 indicating the relative phase relation between the clocks A and B is output from the counter 21.

In FIG. 6, the timings at which the counter value 23 takes on values "0" to "11" correspond to the timings T0 to T11 respectively. That is, the counter value 23 becomes "0" at the timing T0, becomes "1" at the timing T1, and becomes "11" at the timing T11. Then, the counter value 23 becomes "0" again at the timing T0'.

Further, the count value 23 becomes "0", which is the reset value, at the communication timing at which the counter 21 is to be reset.

In the table data 24 of the table circuit 22, a value "0" is set in advance when the pulse of the clock S is to be masked at the next cycle and a value "1" is set when the pulse is not to be masked at the next cycle for each combination of the counter value 23, and the frequency division ratio denominator M, the frequency division ratio numerator N, and the frequency division ratio numerator C. Therefore, the value of the table data 24 according to the combination of the counter value 23, and the frequency division ratio denominator M, the frequency division ratio numerator N, and the frequency division ratio numerator C, which are input at each timing, is output as a mask timing signal 29.

In the case of FIG. 6, the table data 24 in which mask timings are assigned to timings T2, T5 and T8, which are timings other than the communication timings of data communication performed between the circuits A and B, among the timings T0 to T11 of the consecutive M clock pulses of the clock S is set in advance in the table circuit 22. Further, non-mask timings are assigned to the other timings, i.e., timings T0, T1, T3, T4, 16, T7, T9, T10 and T11.

In this way, when the counter value is "2", "5" or "8", for example, a value "0" indicating a mask timing is output as the table data 24 from the table circuit 22 as a mask timing signal 29. Further, for all the other cases, a value "1" indicating a non-mask timing is output as the table data 24 from the table circuit 22 as a mask timing signal 29.

Since the timings T2, T5 and T8 at which the count value 23 is "2", "5" and "8" respectively are not the communication timings (T0, T3, T6 and T9), the mask restraint circuit 62 outputs the value of the mask timing signal 29 as the mask signal 50 without making any alteration. That is, at the timings T2, T5 and T8, the mask restraint circuit 62 outputs "0" indicating a mask timing as the mask signal 50. At the other timings, the mask restraint circuit 62 outputs "1" indicating a non-mask timing as the mask signal 50.

The mask circuit 10 refers to this mask signal 50 and thereby masks pulses of the clock S at the timings T2, T5 and T8. Further, the mask circuit 10 outputs pulses of the clock S in the clock B without masking them at the other timings.

Therefore, the clock pulses of the clock S are always output as the clock B without being masked at the timings T0, T3, T6 and T9 among the timings T0 to T11 of the consecutive M clock pulses. On the other hand, some of the clock pulses at the timings other than the communication timings, i.e., clock pulses at timings T2, T5 and T8 in this example are masked and thereby are not output as the clock B.

Although a generation example in a case where the frequency division ratio of the clock B is 9/12 and the frequency of the clock A is one third of the clock S is shown in FIG. 6, similar operations may be also performed in other cases. By appropriately setting the value of the table data 24 for each combination of the relative phase relation between the clocks A and B, it is possible to realize an arbitrary rational-number frequency division by preventing clock pulses located at the communication timings from being masked without fail and masking some of clock pulses located at the timings other then the communication timings.

Further, although the frequency division ratio denominator M, the frequency division ratio numerator N, the frequency division ratio numerator C, and the like, which are input to the mask control circuit 20, have fixed values in FIG. 6, they may be changed as appropriate during the operation within the range in which the table circuit 22 holds the table data 24 corresponding to these values.

Further, the timing at which a clock pulse of the clock S is masked can be any timing other than the communication timing.

Figure 7:
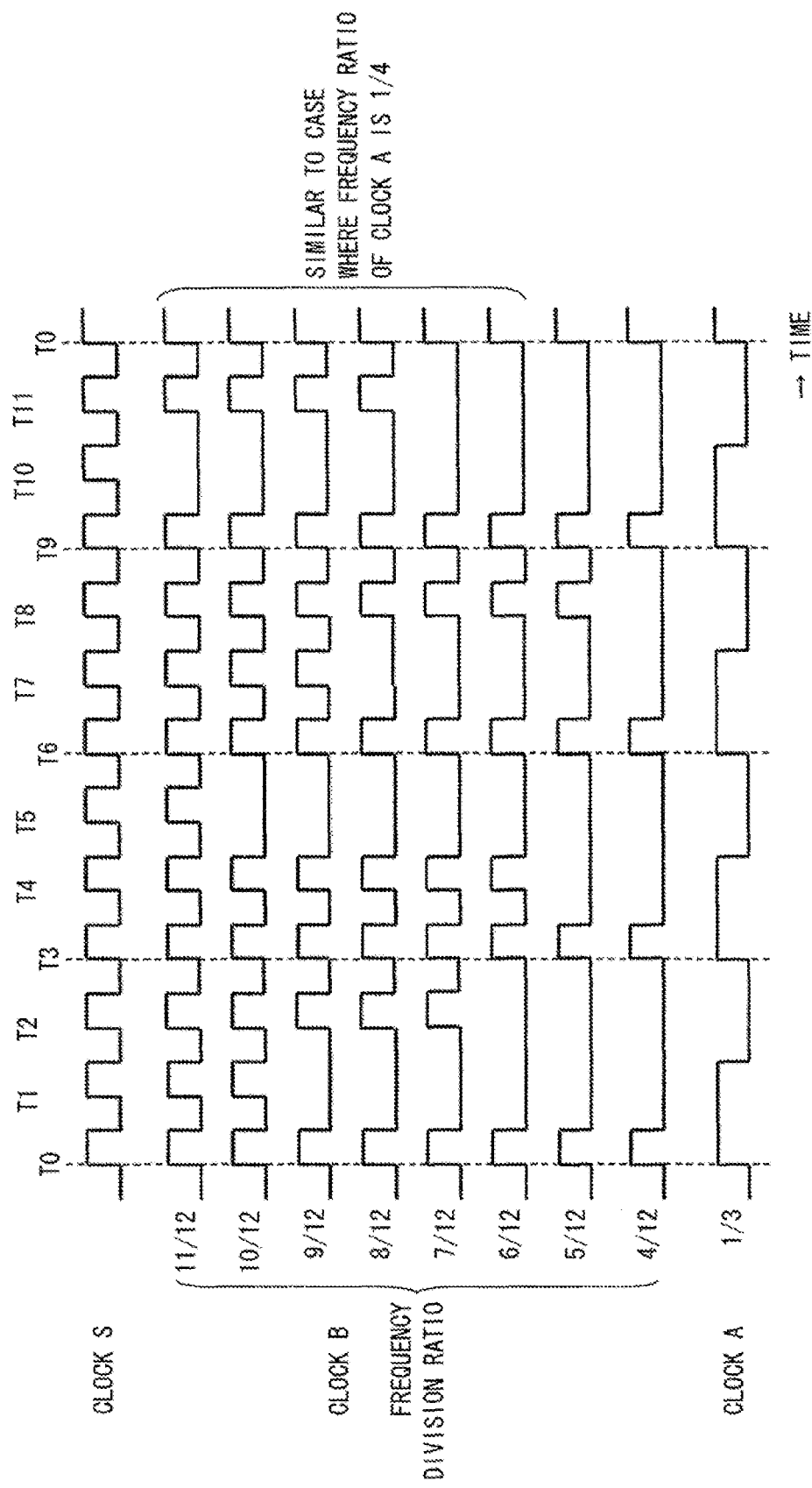
FIG. 7 is a timing chart showing an operation of a clock frequency divider circuit in accordance with a first exemplary embodiment.
Figure 8:
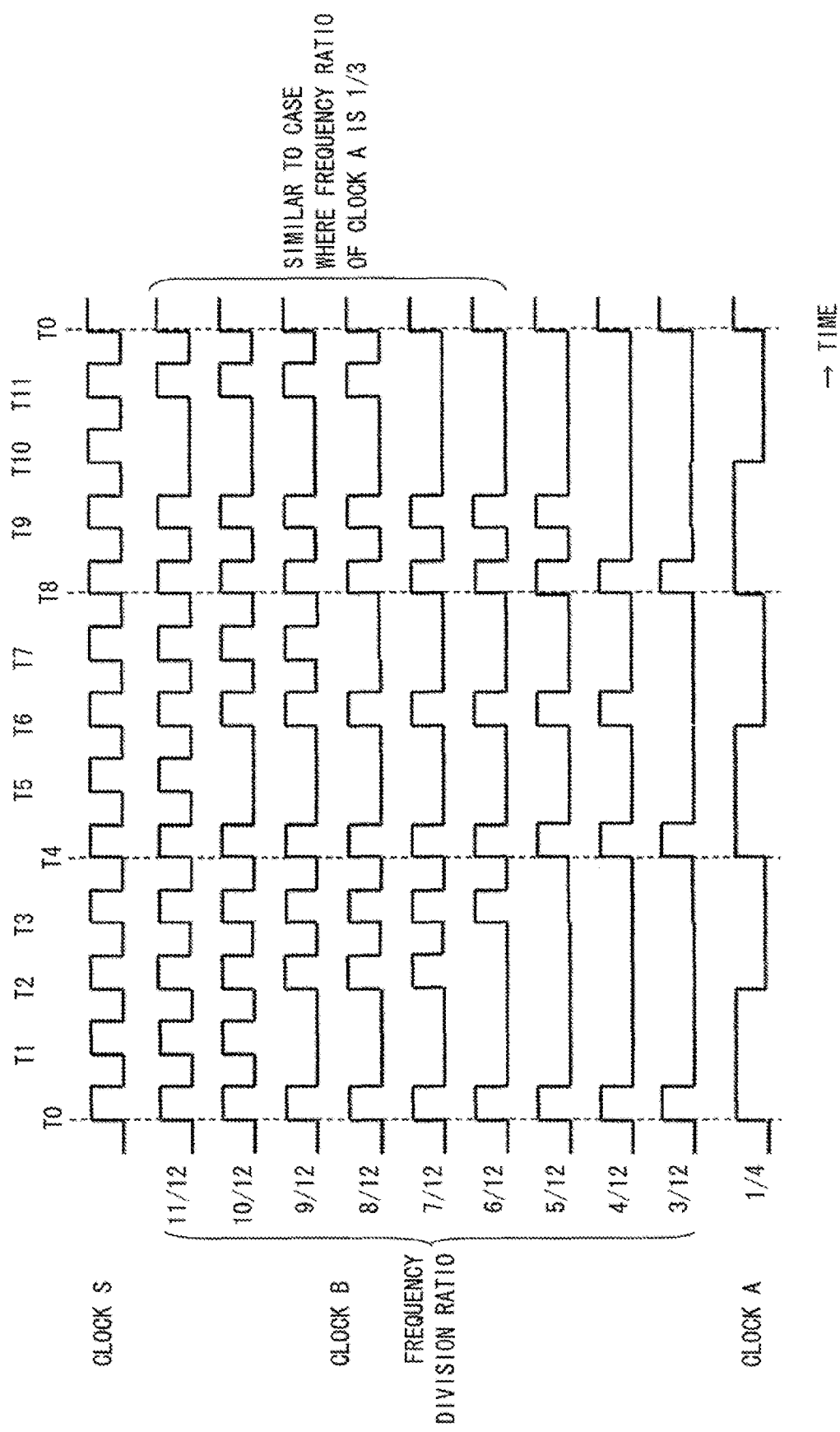
FIG. 8 is a timing chart showing an operation of a clock frequency divider circuit in accordance with a first exemplary embodiment.

FIGS. 7 and 8 are timing charts showing other operations of the clock frequency divider circuit in accordance with this exemplary embodiment.

For example, FIG. 7 shows another generation example of clocks B generated by dividing the frequency of the clock S at frequency division ratios 11/12 to 4/12 under the same condition as FIG. 2 in which the frequency of the clock A is one third of the clock S. Pulses at different timings from those of the generation example in FIG. 2 are masked among the pulses at the timings other than the communication timing, i.e., the timings T1, T2, T4, T5, T7, T8, T10 and T11.

Meanwhile, FIG. 8 shows another generation example of clocks B generated by dividing the frequency of the clock S at frequency division ratios 11/12 to 3/12 when the frequency of the clock A is one fourth of the clock S. The frequency of the clock A is different between the generation examples in FIGS. 7 and 8, and as a result, the communication timings are also different between FIGS. 7 and 8. However, they are characterized in that clocks B corresponding to the frequency division ratios 11/12 to 6/12 are generated by masking pulses at the same timings in the generation examples in FIGS. 7 and 8.

Therefore, since common table data 24 is used to generate clocks B corresponding to the frequency division ratios 11/12 to 6/12 for both cases where the frequency of the clock A is one third of the clock S and where the frequency of the clock A is one fourth of the clock S, there is an advantageous effect that the amount of the hardware for the table circuit 22 can be reduced.

Figure 9:
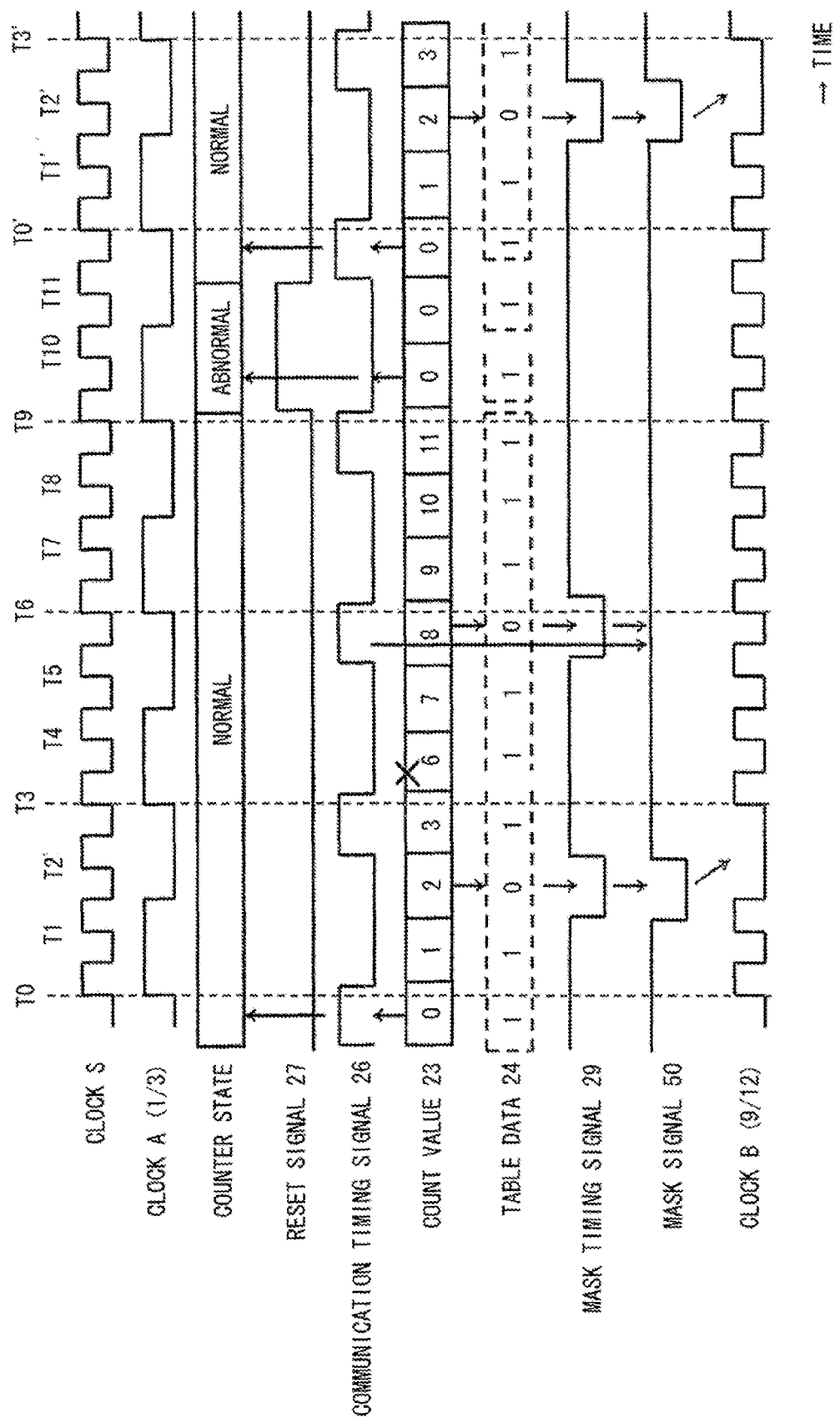
FIG. 9 is a timing chart showing an operation of a clock frequency divider circuit in accordance with a first exemplary embodiment.

Next, an operation of the clock frequency divider circuit in accordance with this exemplary embodiment performed when the clock frequency divider circuit has malfunctioned is explained with reference to FIG. 9. FIG. 9 is a timing chart showing an operation of the clock frequency divider circuit in accordance with this exemplary embodiment performed when a malfunction has occurred.

Similarly to FIG. 6, a case where a clock B corresponding to a frequency division ratio 9/12 is generated from the clock S is explained hereinafter. Assume that the circuit A and the circuit B perform data communication at all the rising edge timings of the clock A. Further, the clock A is in synchronization with the clock B and its frequency division ratio is one third (=4/12) of the clock B.

FIG. 9 shows the state of the error detection circuit 60 shown in FIG. 5 and the value of the reset signal 27 in addition to the signal values shown in FIG. 6.

In the normal operation, the counter 21 becomes "0" at one of the communication timings. After that, the twelve cycles in which the phase relation between the clocks A and B makes a full circle is repeated and the clock pulses of, the clock S is counted. In this way, a counter value 23 indicating the relative phase relation between the clocks A and B is output from the counter 21.

In contrast to this, in FIG. 9, assume that the counter 21 malfunctions due to power-supply noises, for example, at a timing T4. Assume also that, as a result, the count value 23 becomes "6", which is an incorrect value, though it should be "4" in the normal operation state. Further, the count value 23 continues to count incorrect values after that.

Consequently, for example, the count value 23 becomes "8" at the timing T6, which is the communication timing. Therefore, it causes an error that the table circuit 22 outputs, as the table data 24, a value "0" indicting a mask timing as the mask timing signal 29. As a result, if the mask timing signal 29 is output without being altered as a mask signal 50 and the mask circuit 10 thereby masks the clock pulse, it causes an error that data communication cannot be performed properly between the circuits A and B.

In contrast to this, the clock frequency divider circuit in accordance with this exemplary embodiment generates a mask signal 50 that is used to control the mask circuit 10 in such a manner that the mask restraint circuit 62 never masks the clock pulse at the communication timing regardless of the value of the mask timing signal 29. Therefore example, even if the mask timing signal 29 is "0" indicating a mask timing at the timing T6, a value "1" indicating a non-mask timing is output as the mask signal 50.

That is, in the clock frequency divider circuit in accordance with this exemplary embodiment, since the clock pulse is never masked at the communication timing, data communication can be properly performed even when the counter 21 malfunctions and the count value thereby becomes an incorrect value.

Meanwhile, the error detection circuit 60 determines whether or not the count value is a normal value for the communication timing. Further, when an error that the count value 23 is not a normal value is detected, the error detection circuit 60 resets the counter 21 by using the reset signal 27.

Specifically, after a malfunction occurs at the timing T4, the error detection circuit 60 determines whether the communication timing signal 26 is "1" or not at the timing T10 at which the count value 23 becomes "0". At the timing T10, since the count value 23 is "0", the error detection circuit 60 determines that the count value 23 indicates an abnormal value, and thereby changes from the "normal" state to an "abnormal" state.

In the abnormal state, a value "1", which is used to reset the counter 21, is output in the reset signal 27, and the counter 21 thereby performs a reset operation. The error detection circuit 60 remains in the "abnormal" state until the timing T11 which is not a communication timing and at which the communication timing signal 26 is "0". The next timing T0' is a communication timing, and therefore the communication timing signal 26 becomes "1". The error detection circuit 60 changes to a "normal" state. As a result, the counter 21 restarts a normal count operation at and after the timing T0'.

As has been explained above, even if the counter 21 malfunctions and the count value thereby indicates an abnormal value, the error detection circuit 60 autonomously detects the abnormal state and restores the counter 21 to the normal operation by resetting the counter 21.

Further, even during the malfunction state, which begins when a malfunction occurs and continues until the error detection circuit 60 detects the malfunction and it is restored to the normal state, the mask restraint circuit 62 generates a mask signal 50 that is used to control the mask circuit 10 in such a manner that the clock pulse is never masked at the communication timing. In this way, data communication can be properly performed between the circuits A and B.

Further, even if a malfunction occurs in a, component other than the counter 21, the mask restraint circuit 62 generates a mask signal 50 that is used to control the mask circuit 10 in such a manner that the clock pulse is never masked at the communication timing and therefore data communication can be performed properly between the circuits A and B.

In this way, in this exemplary embodiment, in the mask control circuit, the counter counts clock pulses of the input clock signal, and when the count value reaches the frequency division ratio denominator M, the count value is reset. Further, a count value indicating a relative phase of the communication timing with respect to the input clock signal is generated, and a mask signal in which mask timings are assigned based on this count value is generated. In this way, the relative phase of the communication timing with respect to the input clock signal can be derived by using a very simple circuit configuration, i.e., by using a counter, and therefore it is possible to accurately assign mask timings at timings other than the communication timings.

Further, in this exemplary embodiment, in the mask control circuit, table data indicating the necessity/non-necessity of masking for each combination of at least the frequency division ratio setting information and the count value is stored in the table circuit. Further, table data that is output from the table circuit according to the input combination output as a mask signal. By doing so, it is possible to accurately assign desired mask timings at timings other than the communication timings by using a very simple circuit configuration, i.e., by using a table circuit.

Further, the clock frequency divider circuit 100 in accordance with this exemplary embodiment is entirely composed of digital logic circuits and realizes a rational-number frequency division by selecting whether the clock S is masked or not in this way, it is possible to lower the power consumption and reduce the layout size. Further, since the clock frequency divider circuit 100 does not require any analog circuit and any special design, its design/testing costs are low.

Further, in this exemplary embodiment, the mask signal 50 is generated in such a manner that the mask restraint circuit 62 never masks the clock pulse at the communication timing regardless of the value of the mask timing signal 29. Therefore, even if the circuit malfunctions and the mask timing signal 29 thereby indicates an abnormal value, data communication can be properly performed between the circuits A and B. As a result, it is possible to achieve reliable data communication.

Further, in this exemplary embodiment, even if the counter 21 malfunctions and the count value thereby indicates an abnormal value, the error detection circuit 60 autonomously detects the abnormal state and restores the counter 21 to the normal operation by resetting the counter 21. As a result, reliable data communication can be performed between the circuits A and B.

Second Exemplary Embodiment

Next, a clock frequency divider circuit in accordance with a second exemplary embodiment is explained with reference to FIG. 10. The clock frequency divider circuit in accordance with this exemplary embodiment shown in FIG. 10 has a configuration obtained by removing the error detection circuit 60 from the configuration of the clock frequency divider circuit explained in the first exemplary embodiment. For the clock frequency divider circuit in accordance with this exemplary embodiment, duplicated explanation of the components common to those of the first exemplary embodiment is omitted.

The clock frequency divider circuit in accordance with this exemplary embodiment is a clock frequency divider circuit that generates an output clock signal (clock B) that is obtained by dividing the frequency of an input clock signal (clock S) at N/M (N is a positive integer and M is a positive integer greater than N) by masking (M-N) clock pulses among M clock pulses of the input clock signal based on a frequency division ratio defined as N/M.

The clock frequency divider circuit in accordance with this exemplary embodiment includes a mask control circuit 20 and a mask circuit 10.

The mask circuit 10 masks clock pulses of an input clock signal (clock S) according to a mask signal 50 generated by the mask control circuit 20 and thereby generates an output clock signal (clock B).

The mask control circuit 20 includes a mask timing signal generation circuit 22 that generates a mask timing signal 29 used to preferentially mask clock pulses at timings other than communication timings among M clock pulses of the input clock signal based on a communication timing signal 26. Note that the communication timing signal 26 is a signal indicating a communication timing of data communication performed by a target circuit using the output clock signal.

Further, the mask control circuit 20 includes a mask restraint circuit. The mask restraint circuit generates a mask signal 50 that is obtained by processing the mask timing signal so that masking of the clock pulse is restrained at the communication timing 29.

That is, the mask restraint circuit 62 generates the mask signal 50 by referring to the mask timing signal 29 and the communication timing signal 26. In this process, at the communication timing, it generates a mask signal 50 that is used to control the mask circuit 10 in such a manner that the clock pulse is never masked regardless of the value of the mask timing signal 29. On the other hand, at the timings other than the communication timing, it generates a mask signal 50 that is used to control the necessity/non-necessity of masking according to the value of the mask timing signal 29.

Therefore, even if the counter 21 or the mask timing signal generation circuit 22 malfunctions and the mask timing signal 29 thereby indicates an abnormal value, the clock pulse is not masked at least at the communication timing and therefore data communication can be performed properly between the circuits A and B.

Figure 10:
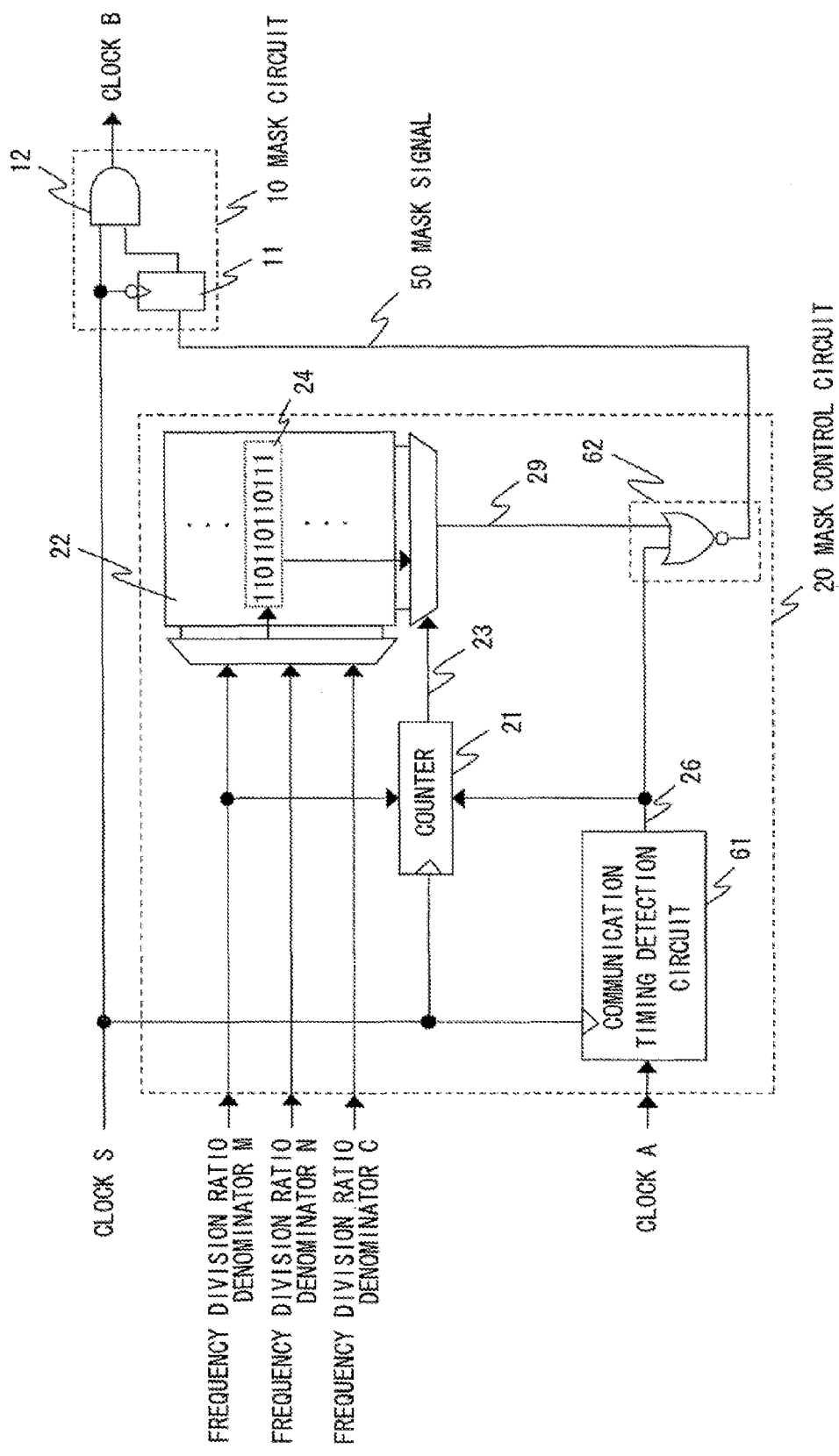
FIG. 10 is a block diagram showing a configuration of a clock frequency divider circuit in accordance with a second exemplary embodiment.

As shown in FIG. 10, for example, the mask restraint circuit 62 can be implemented by using a NOR gate circuit to which the mask timing signal 29 and the communication timing signal 26 are input.

Further, a clock frequency division method in accordance with this exemplary embodiment is a clock frequency division method for generating an output clock signal obtained by dividing the frequency of an input clock signal into N/M (N is a positive integer and M is a positive integer greater than N) by masking (M-N) clock pulses among M clock pulses of the input clock signal based on a frequency division ratio defined as N/M. The frequency division method includes the following steps.

A step of generating a mask timing signal 29 that is used to preferentially mask clock pulses at timings other than communication timings among M clock pulses of the input clock signal (clock S);

a step of generating a mask signal 50 obtained by processing the mask timing signal so that masking of the clock pulse is restrained at the communication timing 29; and a step of generating an output clock signal (clock B) by masking clock pulses of the input clock signal according to the mask signal 50.

Note that the communication timing signal 26 is a signal indicating a communication timing of data communication performed by a target circuit using the output clock signal.

With the invention in accordance with this exemplary embodiment explained above, it is possible to provide a clock frequency divider circuit that generates a clock signal that makes it possible to perform an expected proper communication operation in communication with a circuit operating by a clock having a different frequency, and a clock frequency division method. Note that it is obvious that for the parts common to those of the first exemplary embodiment of the present invention, similar advantageous effects to those of the first exemplary embodiment can be achieved.

Third Exemplary Embodiment

Figure 11:
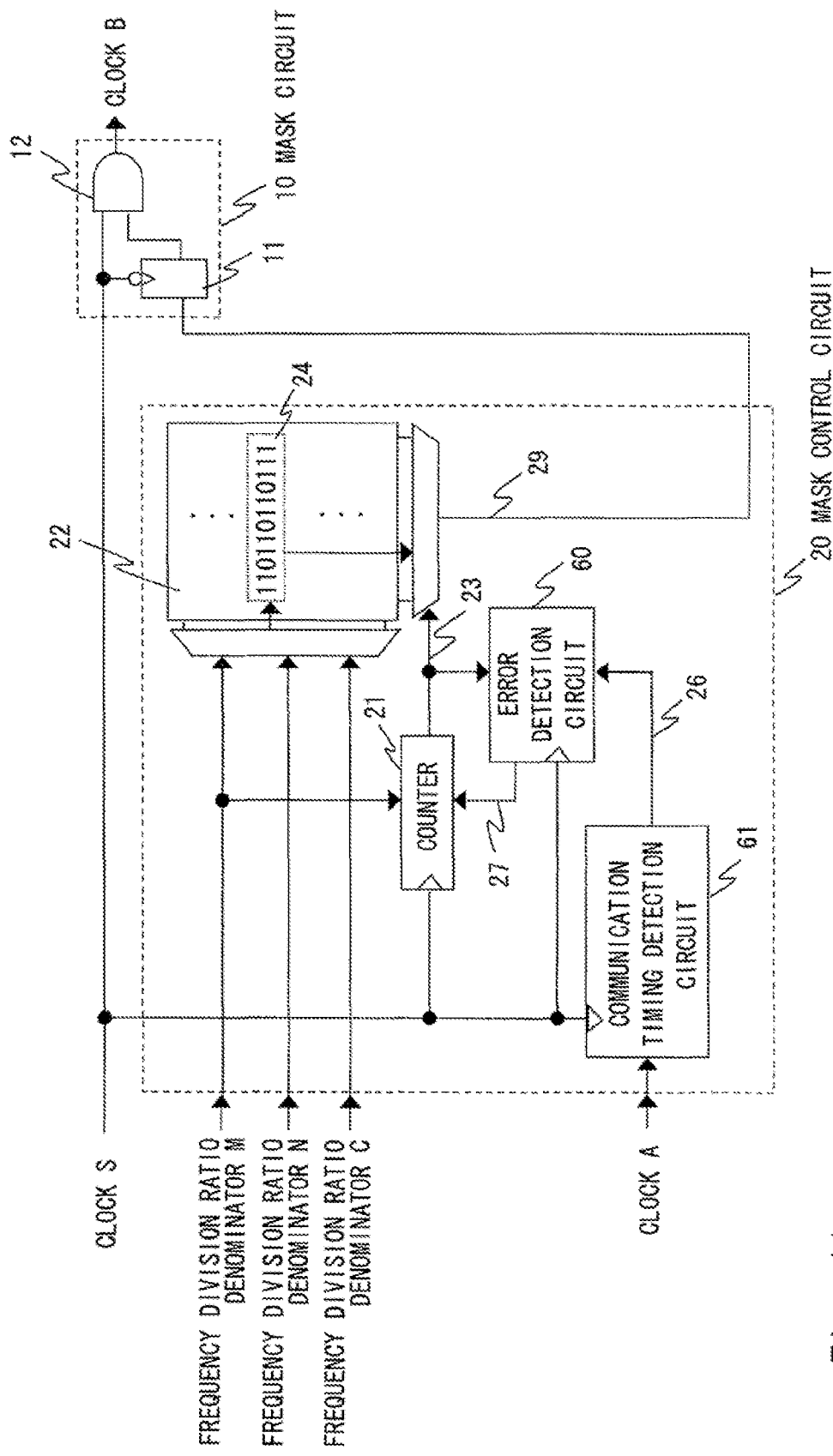
FIG. 11 is a block diagram showing a configuration of a clock frequency divider circuit in accordance with a third exemplary embodiment.

Next, a clock frequency divider circuit in accordance with a third exemplary embodiment is explained with reference to FIG. 11. The clock frequency divider circuit in accordance with this exemplary embodiment shown in FIG. 11 has a configuration obtained by removing the mask restraint circuit 62 from the configuration of the clock frequency divider circuit explained in the first exemplary embodiment. For the clock frequency divider circuit in accordance with this exemplary embodiment, duplicated explanation of the components common to those of the first exemplary embodiment is omitted.

The clock frequency divider circuit in accordance with this exemplary embodiment is a clock frequency divider circuit that generates an output clock signal (clock B) that is obtained by dividing the frequency of an input clock signal (clock S) at N/M (N is a positive integer and M is a positive integer greater than N) by masking (M-N) clock pulses among M clock pulses of the input clock signal based on a frequency division ratio defined as N/M.

The clock frequency divider circuit in accordance with this exemplary embodiment includes a mask control circuit 20 and a mask circuit 10.

The mask circuit 10 masks clock pulses of an input clock signal (clock S) according to a mask timing signal 29 generated by the mask control circuit 20 and thereby generates an output clock signal (clock B). Note that since there is no mask restraint circuit in this exemplary embodiment, the mask timing signal 29 output from the mask timing signal generation circuit 22 is directly input to the mask circuit 10.

The mask control circuit 20 includes a counter 21. The counter 21 generates a count value 23 indicating a relative phase of a communication timing with respect to the input clock signal (clock S) by counting clock pulses of the input clock signal and resetting the count value 23 when the count value 23 reaches the denominator M of the frequency division ratio.

Further, the mask, control circuit 20 includes a mask timing signal generation circuit 22 that generates a mask timing signal 29 used to preferentially mask clock pulses at timings other than communication timings among M clock pulses of the input clock signal based on the count value 23 and the communication timing signal 26. Note that the communication timing signal 26 is a signal indicating a communication timing of data communication performed by a target circuit using the output clock signal.

Further, the mask control circuit 20 includes an error detection circuit 60. The error detection circuit 60 determines whether or not the count value 23 is a normal value for the communication timing, and when the count value 23 is determined to be not a normal value, controls the counter so as to reset the count value.

A specific example of an operation of the error detection circuit 60 is explained with reference to FIG. 5. FIG. 5 is an operation transition diagram showing an operation of the error detection circuit 60.

The error detection circuit 60 is a control circuit having two states consisting of "normal" and "abnormal". Specifically, firstly, in the "normal" state, the error detection circuit 60 determines whether or not the communication timing signal 26 is "1" indicating a communication timing at the timing at which the count value 23 becomes "0", which is the reset value of the counter 21, by referring to the input count value 23 and the communication timing signal 26.

If the communication timing signal 26 is "1" at the timing at which the count value 23 becomes "0", the error detection circuit 60 determines that the count value 23 indicates a normal value and remains in the "normal" state. In the "normal" state, "0" is output to the reset signal 27 so that the counter 21 is not reset, and therefore the counter 21 performs a normal count operation.

On the other hand, if the communication timing signal 26 is "0" at the timing at which the count value 23 becomes "0", the error detection circuit 60 determines that the count value 23 indicates an abnormal value and changes to an "abnormal" state. In the "abnormal" state, "1" is output to the reset signal 27 so that the counter 21 is reset, and therefore the counter 21 performs a reset operation. When it is not in the communication timing, i.e., when the communication timing signal 26 is "0", the error detection circuit 60 remains in the "abnormal" state.

On the other hand, when the communication timing signal 26 becomes "1" indicating a communication timing, the error detection circuit 60 changes to a "normal" state and the counter 21 restarts the normal count operation.

As explained above, the error detection circuit 60 determines whether the count value 23 is a normal value or not by determining Whether or not the timing at which the count value 23 becomes the reset value of the counter 21 is simultaneous with the communication timing at which the counter 21 is to be reset.

Further, when the count value 23 is determined to be not a normal value, the counter 21 is reset at the timing at which the counter 21 is to be reset (communication timing). Therefore, even if the counter 21 malfunctions and the count value thereby indicates an abnormal value, it is autonomously detected and the counter 21 can be restored to the normal operation.

Further, a clock frequency division method in accordance with this exemplary embodiment is a clock frequency division method for generating an output clock signal obtained by dividing the frequency of an input clock signal into N/M (N is a positive integer and M is a positive integer greater than N) by masking (M-N) clock pulses among M clock pulses of the input clock signal based on a frequency division ratio defined as N/M. The frequency division method includes the following steps.

A step of generating a count value indicating a relative phase of a communication timing with respect to the input clock signal by counting clock pulses of the input clock signal (clock S) and resetting the count value 23 when the count value reaches the denominator M of the frequency division ratio;

a step of generating a mask timing signal 29 used to preferentially mask clock pulses at timings other than communication timings among M clock pulses of the input clock signal based on the count value 23 and the communication timing signal 26;

a step of determining whether or not the count value is a normal value for the communication timing, and when the count value is determined to be not a normal value, controlling the counter so as to reset the count value; and a step of generating an output clock signal (clock B) by masking clock pulses of the input clock signal (clock S) according to the mask timing signal 29.

Note that the communication timing signal 26 is a signal indicating a communication timing of data communication performed by a target circuit using the output clock signal.

With the invention in accordance with this exemplary embodiment explained above, it is possible to provide a clock frequency divider circuit that generates a clock signal that makes it possible to perform an expected proper communication operation in communication with a circuit operating by a clock having a different frequency, and a clock frequency division method. Note that it is obvious that for the parts common to those of the first exemplary embodiment of the present invention, similar advantageous effects to those of the first exemplary embodiment can be achieved.

Fourth Exemplary Embodiment

Next, a clock frequency divider circuit in accordance with a fourth exemplary embodiment is explained with reference to FIG. 12. Note that duplicated explanation of the components common to those of the first exemplary embodiment is omitted.

Figure 12:
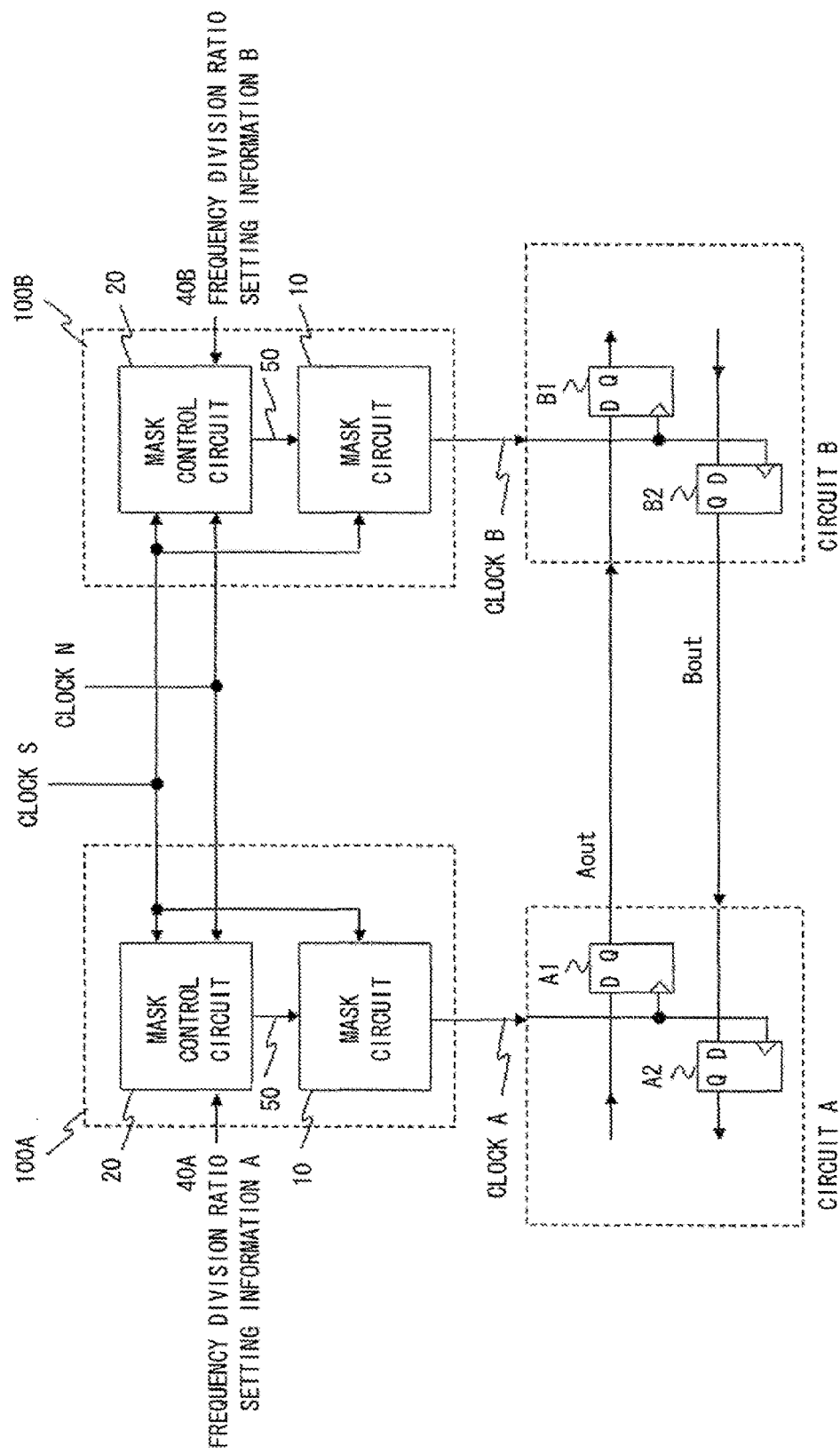
FIG. 12 is a block diagram showing a configuration of a clock frequency divider circuit in accordance with a fourth exemplary embodiment.

FIG. 12 is an explanatory diagram showing an application example of a clock frequency divider circuit in accordance with a fourth exemplary embodiment of the present invention.

FIG. 12 shows an example of a semiconductor integrated circuit including a circuit A operating by a clock A and a circuit B operating by a clock B. Further, a clock frequency divider circuit 100A similar to that of the clock frequency divider circuit 100 shown in FIG. 1 is provided in the circuit A, and a clock frequency divider circuit 100B similar to that of the clock frequency divider circuit 100 shown in FIG. 1 is provided in the circuit B.

A clock N indicating a communication timing between the circuits A and B as well as frequency division ratio setting information B (40B) used to set the frequency division ratio of the clock B are input to the clock frequency divider circuit 100B. The clock frequency divider circuit 100B generates a clock B by dividing the frequency of a clock S by a rational number based on the frequency division ratio setting information B (40B) and the clock N.

Meanwhile, the clock N indicating a communication timing between the circuits A and B as well as frequency division ratio setting information A (40A) used to set the frequency division ratio of the clock A are input to the clock frequency divider circuit 100A. The clock frequency divider circuit 100A generates a clock A by dividing the frequency of the clock S by a rational number based on the frequency division ratio setting information A (40A) and the clock N.

The circuits A and B communicate with each other at the rising edge timings of the clock N through signals Aout and Bout. In this example, the circuit A outputs a signal Aout by driving a flip-flop circuit A1 with the clock A and the circuit B receives the signal Aout by driving a flip-flop circuit B1 with the clock B. Meanwhile, the circuit B outputs a signal Bout by driving a flip-flop circuit B2 with the clock B and the circuit A receives the signal Bout by driving a flip-flop circuit A2 with the clock A.

Figure 13:
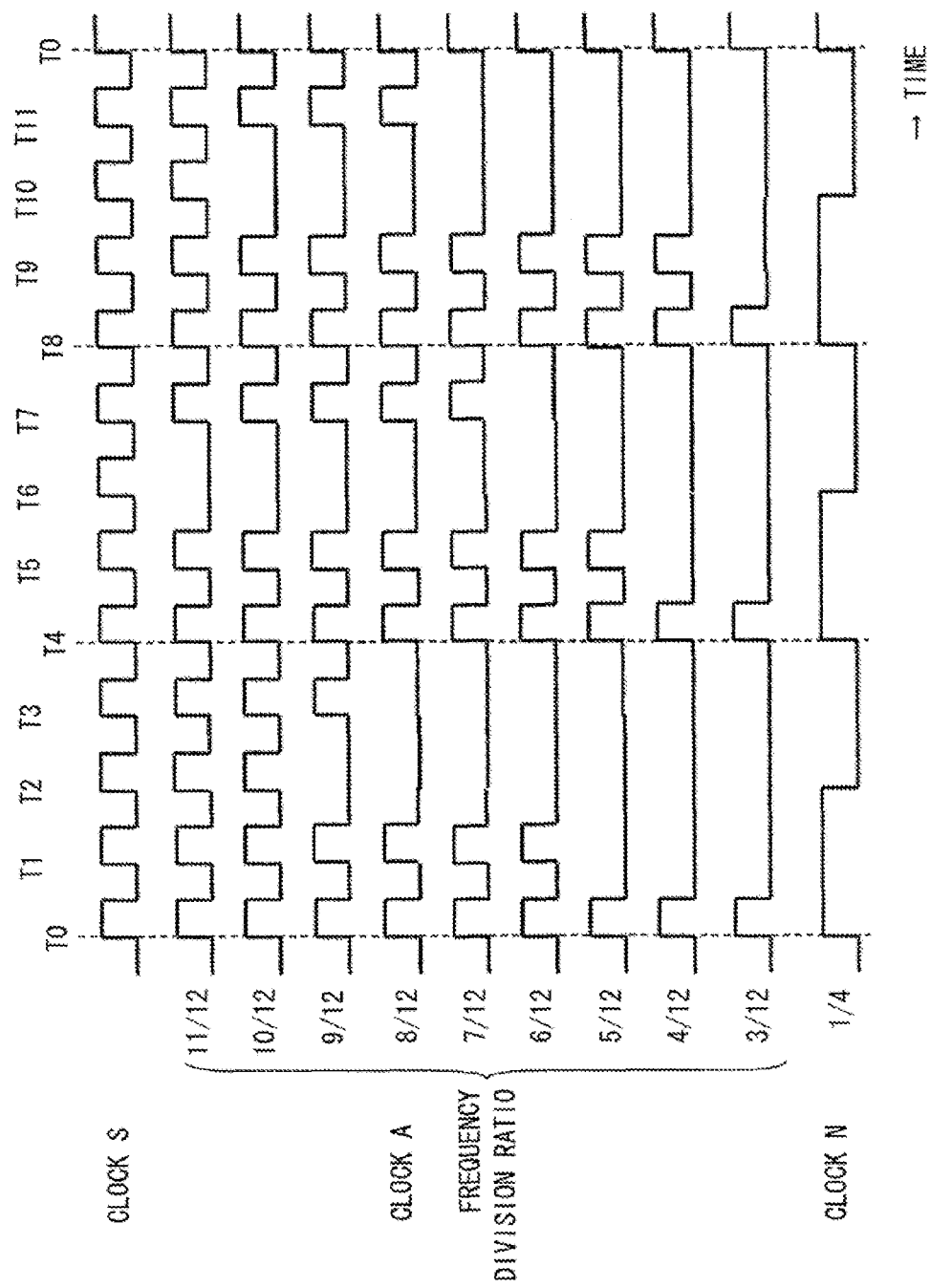
FIG. 13 is a timing chart showing an operation of a clock frequency divider circuit in accordance with a fourth exemplary embodiment.
Figure 14:
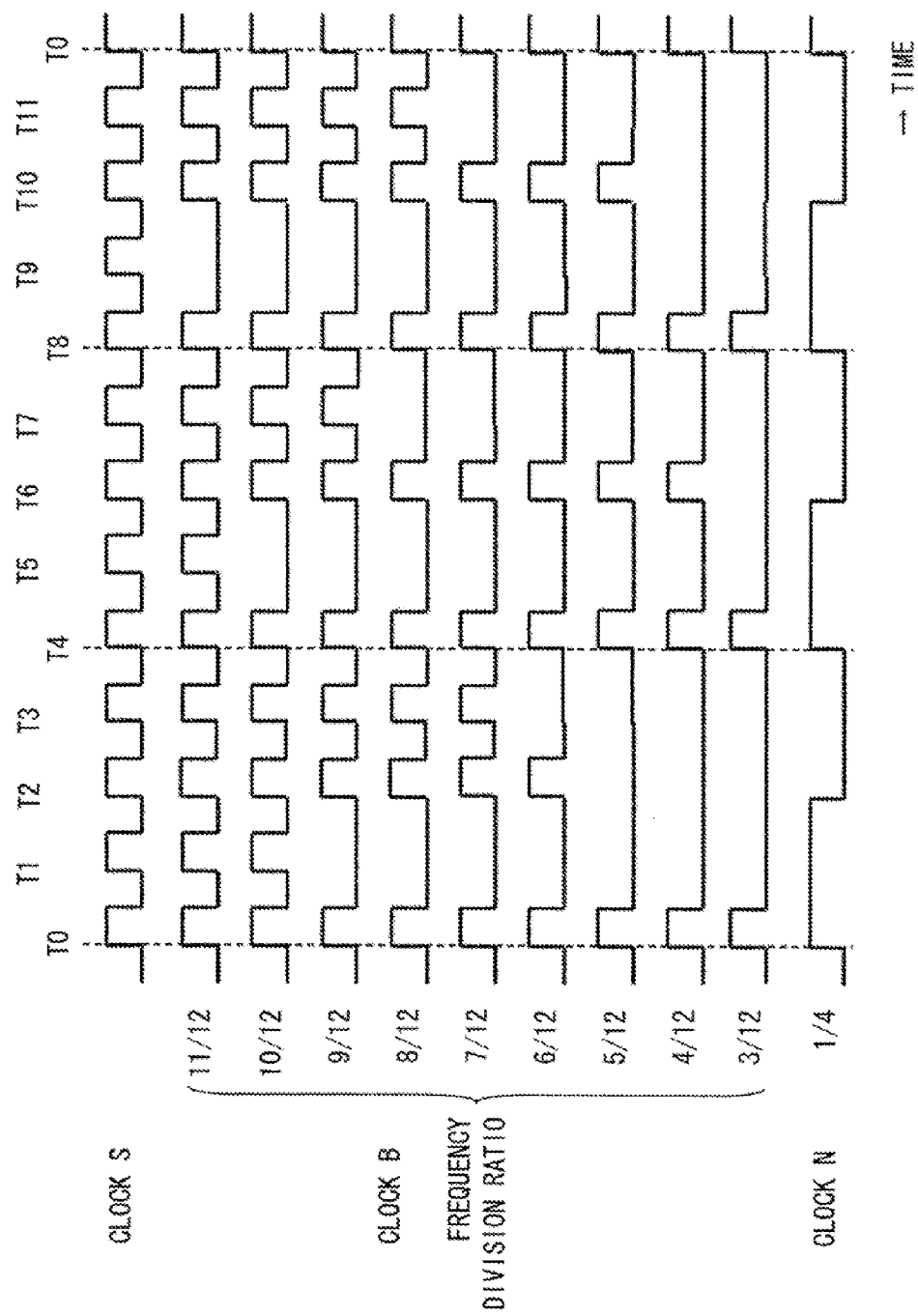
FIG. 14 is a timing chart showing an operation of a clock frequency divider circuit in accordance with a fourth exemplary embodiment.

FIGS. 13 and 14 are timing charts showing an operation of the clock frequency divider circuit in accordance with this exemplary embodiment.

An example of the generation of clocks A and B is explained with reference to FIGS. 13 and 14. Note that the frequency of the clock N is one fourth (=3/12) of the clock S, and the clocks A and B are generated by dividing the frequency of the clock S at frequency division ratios 11/12 to 3/12.

Since the frequency division ratio denominators M of the clocks A, B and N to the clock S are all twelve, the phase relations between the clock A and the clock N and between the clock B and the clock N make a full circle in twelve cycles of the clock S. The timings of the twelve cycles, in which the phase relations make a full circle, are represented by "T0" to "T11". The circuit A and the circuit B communicate with each other at the timings T0, T4 and T8, which correspond to all the rising edge timings of the clock N.

The clock frequency divider circuit 100A and the clock frequency divider circuit 100B receive the clock N indicating the above-mentioned communication timings at the respective mask control circuits 20. The mask control circuits 20 control the mask circuits 10 in such a manner that clock pulses at the communication timings of the communication between them are never masked and some of the clock pulses at the timings other than the communication timings are masked.

The mask control circuits 20 generate respective mask signals 50 that are used to mask clock pulses at the timings other than the communication timings among the clock pulses of the clock S. That is, (M-N) mask timings at each of which a clock pulse is masked are assigned to some of the timings other than the timings T0, T4 and T8.

For example, in FIG. 13, a clock A corresponding to a frequency division ratio 11/12 can be generated by assigning a mask timing at a timing other than the timings T0, T4 and T8 among the twelve clock pulses at the timings T0 to T11 of the clock S, e.g., at a timing T6. Further, a clock A corresponding to a frequency division ratio 10/12 can be generated by additionally assigning a mask timing at a timing T10.

Similarly, in FIG. 14, a clock B corresponding to a frequency division ratio 11/12 can be generated by assigning a mask timing at a timing other than the timings T0, T4 and T8 among the twelve clock pulses at the timings T0 to T11 of the clock S, e.g., at a timing T9. Further, a clock B corresponding to a frequency division ratio 10/12 can be generated by additionally assigning a mask timing at a timing T5.

With the invention in accordance with this exemplary embodiment, it is also possible to provide a clock frequency divider circuit that generates a clock signal that makes it possible to perform an expected proper communication operation in communication between circuits operating by clocks having different frequencies. Note that it is obvious that for the parts common to those of the other exemplary embodiments of the present invention, similar advantageous effects to those of the other exemplary embodiments can be achieved.

Fifth Exemplary Embodiment

Figure 15:
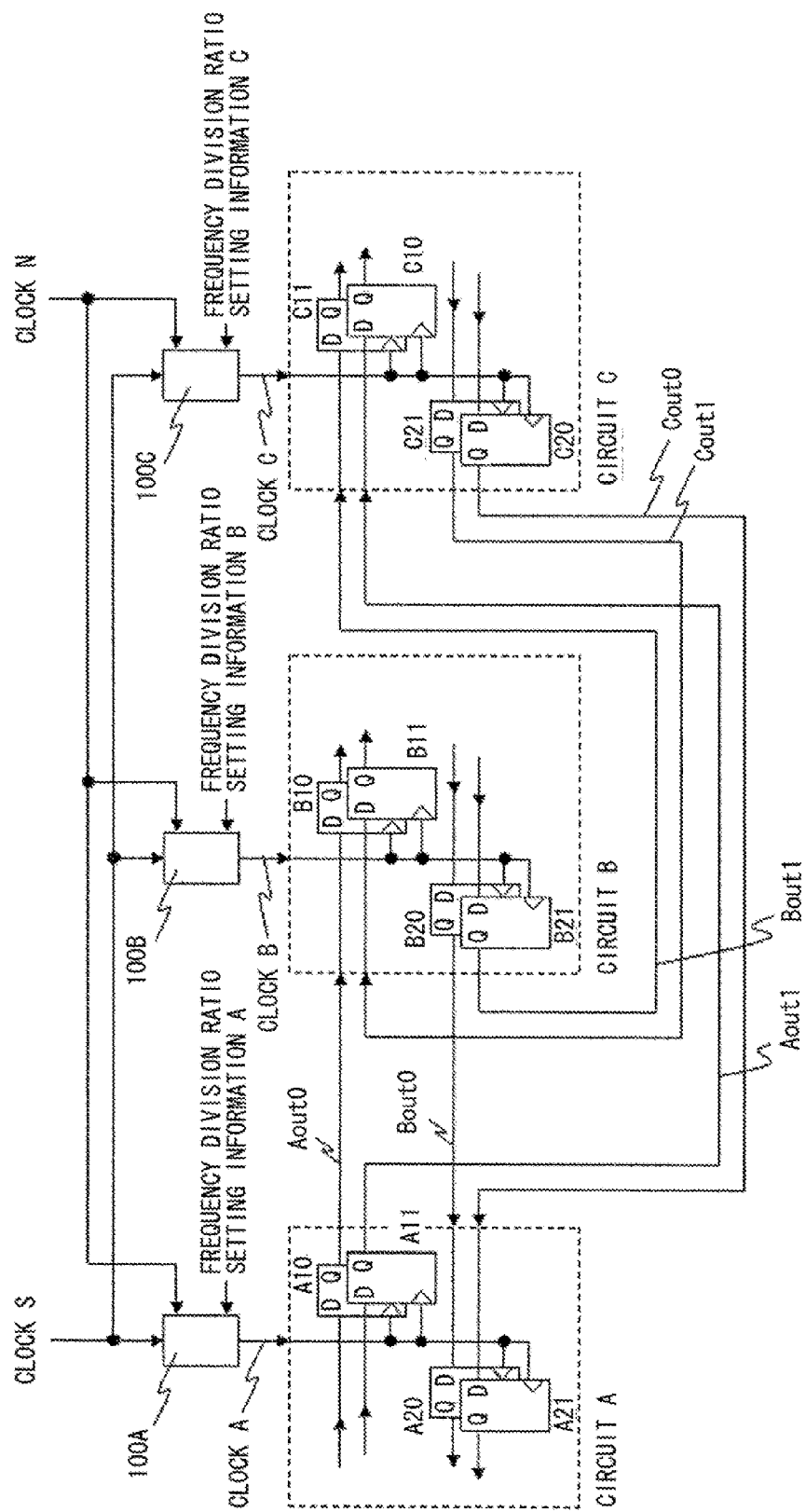
FIG. 15 is a block diagram showing a configuration of a clock frequency divider circuit in accordance with a fifth exemplary embodiment.

Next, a clock frequency divider circuit in accordance with a fifth exemplary embodiment is explained with reference to FIG. 15. FIG. 15 shows a clock frequency divider circuit in accordance with a fifth exemplary embodiment of the present invention.

In the fourth exemplary embodiment, a case where two circuits, i.e., the circuit A operating by a clock A and the circuit B operating by a clock B communicate with each other is explained. In the fifth exemplary embodiment, a case where there are three or more clocks and circuits is explained. Note that duplicated explanation of the components common to those of the first or fourth exemplary embodiment is omitted.

FIG. 15 shows an example of a semiconductor integrated circuit including a circuit A operating by a clock A, a circuit B operating by a clock B, and a circuit C operating by a clock C. Further, a clock frequency divider circuit 100A similar to that of the clock frequency divider circuit 100 shown in FIG. 1 is provided in the circuit A; a clock frequency divider circuit 100B similar to that of the clock frequency divider circuit 100 shown in FIG. 1 is provided in the circuit B; and a clock frequency divider circuit 100C similar to that of the clock frequency divider circuit 100 shown in FIG. 1 is provided in the circuit C.

A clock N indicating a communication timing among the clocks A, B and C as well as frequency division ratio setting A used to set the frequency division ratio of the clock A are input to the clock frequency divider circuit 100A. Further, the clock frequency divider circuit 100A generates a clock A by dividing the frequency of a clock S by a rational number based on these inputs. Similarly, the clock frequency divider circuit 100B receives the clock N indicating the above-described communication timing as well as frequency division ratio setting B used to set the frequency division ratio of the clock B, and generates a clock B by dividing the frequency of the clock S by a rational number based on these inputs. Similarly, the clock frequency divider circuit 100C receives the clock N indicating the above-described communication timing as well as frequency division ratio setting C used to set the frequency division ratio of the clock C, and generates a clock C by dividing the frequency of the clock S by a rational number based on these inputs.

The circuits A, B and C communicate with one another at communication timings based on the clock N. Among these circuits, the circuits A and B communicate with each other through signals Aout0 and Bout0. In the communication, the circuit A outputs the signal Aout0 by driving a flip-flop circuit A10 at a rising edge of the clock A and the circuit B receives the signal Aout0 by driving a flip-flop circuit B10 at a rising edge of the clock B. Further, the circuit B outputs the signal Bout0 by driving a flip-flop circuit B20 at a rising edge of the clock B and the circuit A receives the signal Bout0 by driving a flip-flop circuit A20 at a rising edge of the clock A.

Further, the circuits A and C communicate with each other through signals Aout1 and Cout0. In the communication, the circuit A outputs the signal Aout1 by driving a flip-flop circuit A11 at a rising edge of the clock A and the circuit C receives the signal Aout1 by driving a flip-flop circuit C10 at a rising edge of the clock C. Further, the circuit C outputs the signal Cout0 by driving a flip-flop circuit C20 at a rising edge of the clock C and the circuit A receives the signal Cout0 by driving a flip-flop circuit A21 at a rising edge of the clock A.

Further, the circuits B and C communicate with each other through signals Bout1 and Cout1. In the communication, the circuit B outputs the signal Bout1 by driving a flip-flop circuit B21 at a rising edge of the clock B and the circuit C receives the signal Bout1 by driving a flip-flop circuit C11 at a rising edge of the clock C. Further, the circuit C outputs the signal Cout1 by driving a flip-flop circuit C21 at a rising edge of the clock C and the circuit B receives the signal Cout1 by driving a flip-flop circuit B21 at a rising edge of the clock B.

Figure 16:
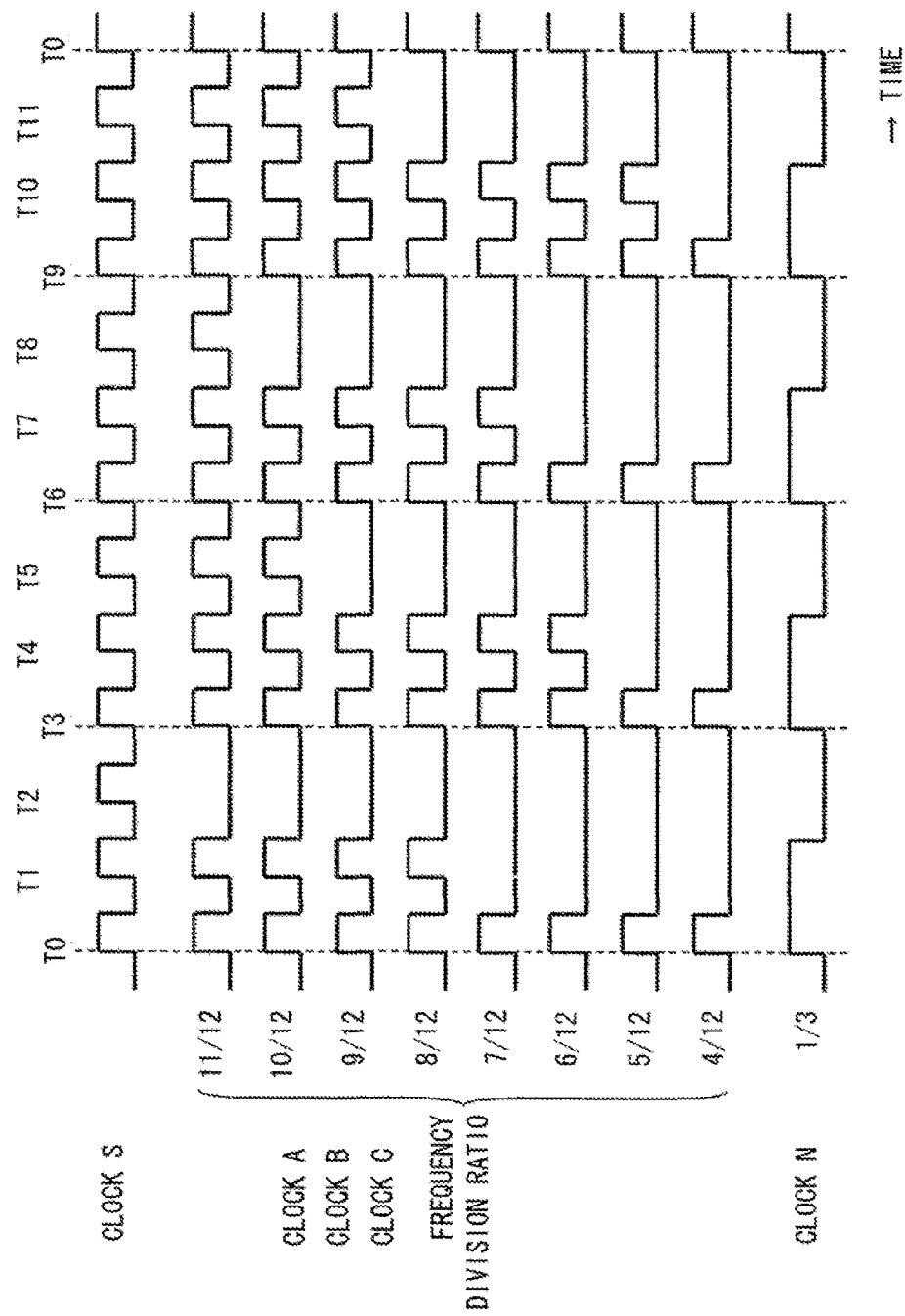
FIG. 16 is a timing chart showing an operation of a clock frequency divider circuit in accordance with a fifth exemplary embodiment.
Figure 17:
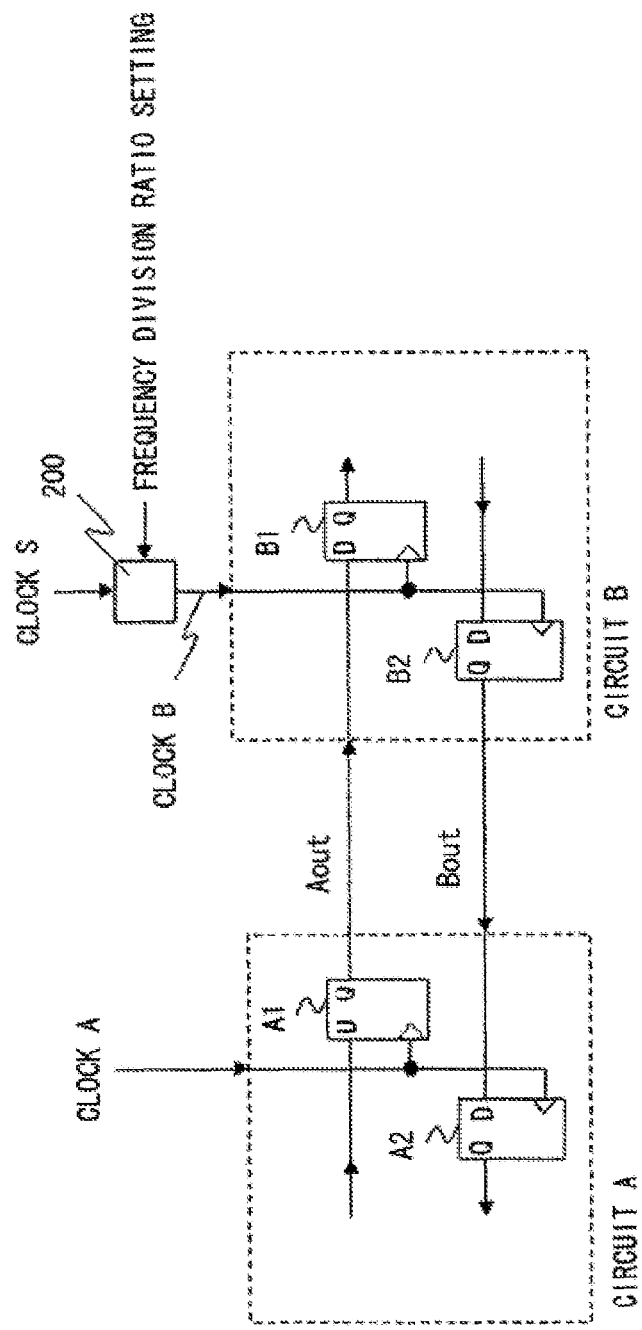
FIG. 17 is a block diagram showing a configuration of a clock frequency divider circuit in related art.
Figure 18:
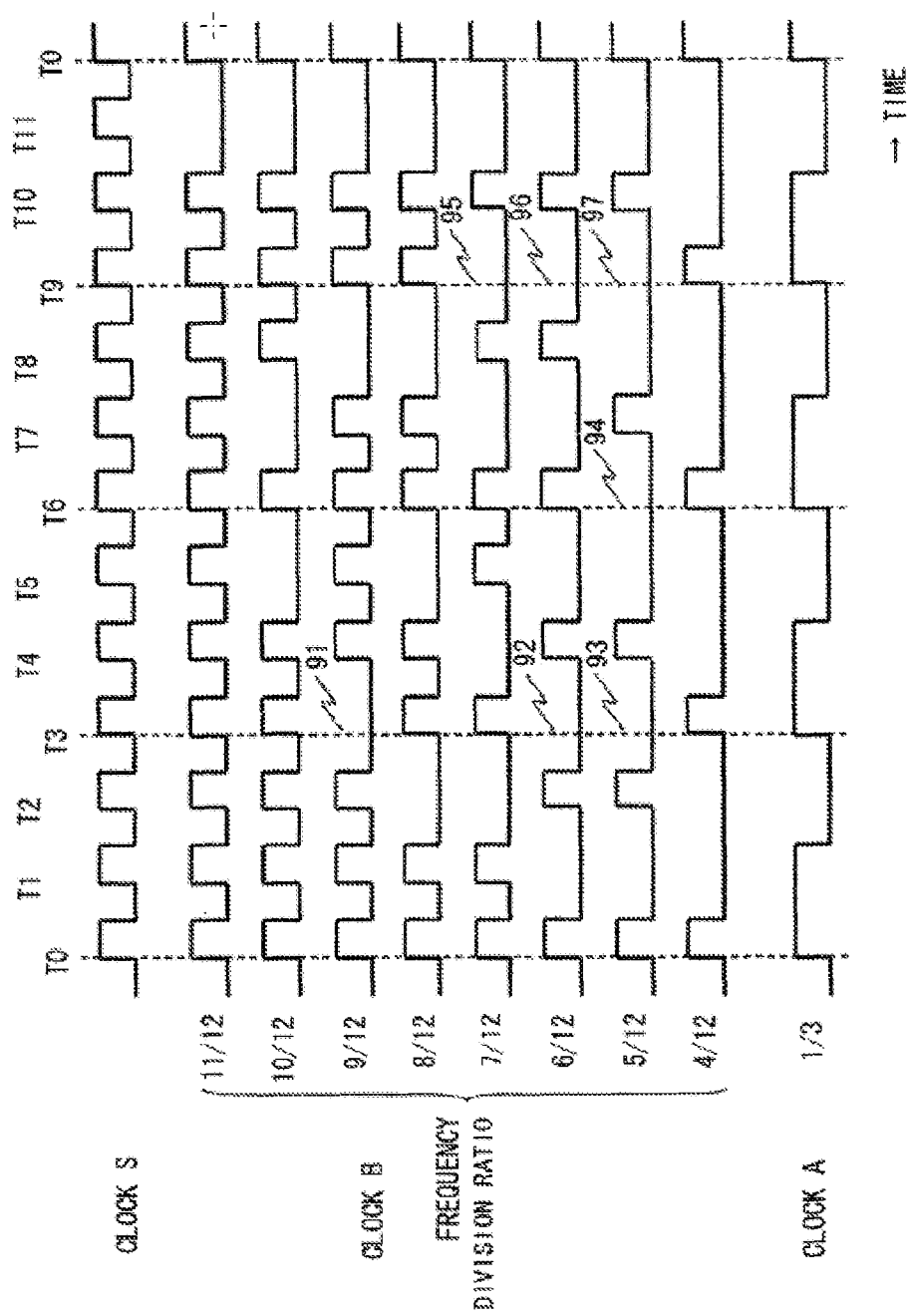
FIG. 18 is a timing chart showing the operation of a clock frequency divider circuit in related art.

FIG. 16 is a timing chart showing an operation of the clock frequency divider circuit in accordance with this exemplary embodiment. This example shows clocks A, B and C that are generated by dividing the frequency of the clock S at frequency division ratios 11/12 to 4/12. Assume that the circuits A, B and C perform communication at timings T0, T3, T6 and T9.

In this exemplary embodiment, the clock frequency divider circuit 100A, the clock frequency divider circuit 100B, and the clock frequency divider circuit 100C receive the clock N indicating the above-described communication timing. Then, the clock frequency divider circuits realize a rational-number frequency division by performing control based on the clock N in such a manner that clock pulses at the communication timings are never masked and some of the clock pulses at the timings other than the communication timings are masked.

Specifically, the clocks A, B and C are generated by preventing the clock pulses from being masked at the timings T0, T3, T6 and T9, which are the communication timings, and masking some of the clock pulses at the timings T1, T2, T4, T5, T7, T8, T10 and T11, which are non-communication timings.

As described above, in this exemplary embodiment, a clock pulse exists at the communication timing without fail in the clock generated by the clock frequency divider circuit. Therefore, an expected proper communication operation can be realized in communication between circuits using clocks having different frequencies.

Further, in communication between circuits using a clock having a different frequency, effective communication can be performed without deteriorating the communication performance. Furthermore, even when the frequency division ratio is changed, it is unnecessary to change the communication timing of the communication with a circuit using a clock having a different frequency according to the change. For example, in the example of clock frequency division shown in FIG. 16, even when the frequency division ratio of the clocks A, B and C is changed to any of the frequency division ratios 11/12 to 4/12, it is unnecessary to change the communication timings T0, T3, T6 and T9, thus making it possible to cope with the change in a flexible manner.

In the invention in accordance with this exemplary embodiment, it is also possible to provide a clock frequency divider circuit that generates a clock signal that makes it possible to perform an expected proper communication operation in communication with a circuit operating by a clock having a different frequency. Note that it is obvious that for the parts common to those of the other exemplary embodiments of the present invention, similar advantageous effects to those of the other exemplary embodiments can be achieved.

Although the present invention is explained above with reference to specific exemplary embodiments, the present invention is not limited to the above-described exemplary embodiments. Various modifications that can be easily understood by those skilled in the art can be made to the configurations and the details of the present invention without departing from the scope of the present invention.

REFERENCE SIGNS LIST

10 MASK CIRCUIT
11 LATCH CIRCUIT
12 GATE CIRCUIT
20 MASK CONTROL CIRCUIT
21 COUNTER
22 TABLE CIRCUIT (MASK TIMING SIGNAL GENERATION CIRCUIT)
23 COUNT VALUE
24 TABLE DATA
26 COMMUNICATION TIMING SIGNAL
27 RESET SIGNAL
29 MASK TIMING SIGNAL
40 FREQUENCY DIVISION RATIO SETTING INFORMATION
50 MASK SIGNAL
60 ERROR DETECTION CIRCUIT
61 COMMUNICATION TIMING DETECTION CIRCUIT
62 MASK RESTRAINT CIRCUIT
65 TOGGLE CIRCUIT
70 TOGGLE DETECTION CIRCUIT
100, 100A, 100B, 100C CLOCK FREQUENCY DIVIDER CIRCUIT

The invention claimed is:

1. A clock frequency divider circuit that generates an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, comprising:
   a mask control circuit comprising:
   a mask timing signal generation circuit that generates a mask timing signal used to preferentially masks a clock pulse at a timing other than a communication timing of data communication performed by a target circuit using the output clock signal among M clock pulses of the input clock signal based on a communication timing signal indicating the communication timing; and
   a mask restraint circuit that generates a mask signal obtained by processing the mask timing signal so that masking of the clock pulse is restrained at the communication timing; and
   a mask circuit that generates the output clock signal by masking a clock pulse of the input clock signal according to the mask signal generated by the mask control circuit.

2. The clock frequency divider circuit according to claim 1, wherein
   the mask control circuit comprises a counter that generates a count value indicating a relative phase of the communication timing with respect to the input clock signal by counting a clock pulse of the input clock signal and resetting a count value when the count value reaches a denominator M of the frequency division ratio, and generates the mask signal based on the count value.

3. The clock frequency divider circuit according to claim 2, further comprising an error detection circuit that determines whether or not the count value is a normal value for the communication timing, and when the count value is determined to be not a normal value, controls the counter so as to reset the count value.

4. A clock frequency divider circuit that generates an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, comprising:
   a counter that generates a count value indicating a relative phase of a communication timing with respect to the input clock signal by counting a clock pulse of the input clock signal and resetting a count value when the count value reaches a denominator M of the frequency division ratio;

a mask control circuit comprising:
- a mask timing signal generation circuit that generates a mask timing signal used to preferentially masks a clock pulse at a timing other than a communication timing of data communication performed by a target circuit using the output clock signal among M clock pulses of the input clock signal based on the count value and a communication timing signal indicating the communication timing; and
- an error detection circuit that determines whether or not the count value is a normal value for the communication timing, and when the count value is determined to be not a normal value, controls the counter so as to reset the count value; and
- a mask circuit that generates the output clock signal by masking a clock pulse of the input clock signal according to the mask timing signal generated by the mask control circuit.

5. The clock frequency divider circuit according to claim 2, wherein the mask timing signal generation circuit comprises a table circuit that holds in advance table data indicating necessity/non-necessity of masking for each combination of at least the counter value, and a frequency division ratio denominator M and a frequency division ratio numerator N of the frequency division ratio, and outputs table data output from the table circuit according to the input combination as the mask timing signal.

6. The clock frequency divider circuit according to claim 1, further comprising a communication timing detection circuit that detects a rising edge timing of a clock signal input as a reference of a communication timing, and thereby generates the communication timing signal.

7. A clock frequency division method for generating an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, comprising:
- generating a mask timing signal used to preferentially masks a clock pulse at a timing other than a communication timing of data communication performed by a target circuit using the output clock signal among M clock pulses of the input clock signal based on a communication timing signal indicating the communication timing;
- generating a mask signal obtained by processing the mask timing signal so that masking of the clock pulse is restrained at the communication timing; and
- generating the output clock signal by masking a clock pulse of the input clock signal according to the mask signal.

8. The clock frequency divider method according to claim 7, wherein a count value indicating a relative phase of the communication timing with respect to the input clock signal is generated by counting a clock pulse of the input clock signal and resetting a count value when the count value reaches a denominator M of the frequency division ratio, and the mask signal is generated based on the count value.

9. The clock frequency divider method according to claim 8, wherein whether or not the count value is a normal value for the communication timing is determined, and when the count value is determined to be not a normal value, the count value is reset.

10. A clock frequency division method for generating an output clock signal obtained by dividing a frequency of an input clock signal into N/M (N is a positive integer and M is a positive integer greater than N) by masking (M-N) clock pulses among M clock pulses of the input clock signal based on a frequency division ratio defined as N/M, comprising:
- generating a count value indicating a relative phase of a communication timing with respect to the input clock signal by counting a clock pulse of the input clock signal and resetting a count value when the count value reaches a denominator M of the frequency division ratio;
- generating a mask timing signal used to preferentially masks a clock pulse at a timing other than a communication timing of data communication performed by a target circuit using the output clock signal among M clock pulses of the input clock signal based on the count value and a communication timing signal indicating the communication timing;
- determining whether or not the count value is a normal value for the communication timing, and when the count value is determined to be not a normal value, resetting the count value; and
- generating the output clock signal by masking a clock pulse of the input clock signal according to the mask timing signal.

11. The clock frequency divider method according to claim 8, wherein table data indicating necessity/non-necessity of masking for each combination of at least the counter value, and a frequency division ratio denominator M and a frequency division ratio numerator N of the frequency division ratio is stored in advance, and the table data is output as the mask timing signal according to the input combination.

12. The clock frequency divider method according to claim 7, wherein the communication timing signal is generated by detecting a rising edge timing of a clock signal input as a reference of a communication timing.

13. The clock frequency divider circuit according claim 4, wherein the mask timing signal generation circuit comprises a table circuit that holds in advance table data indicating necessity/non-necessity of masking for each combination of at least the counter value, and a frequency division ratio denominator M and a frequency division ratio numerator N of the frequency division ratio, and outputs table data output from the table circuit according to the input combination as the mask timing signal.

14. The clock frequency divider circuit according to claim 4, further comprising a communication timing detection circuit that detects a rising edge timing of a clock signal input as a reference of a communication timing, and thereby generates the communication timing signal.

15. The clock frequency divider method according to claim 10, wherein table data indicating necessity/non-necessity of masking for each combination of at least the counter value, and a frequency division ratio denominator M and a frequency division ratio numerator N of the frequency division ratio is stored in advance, and the table data is output as the mask timing signal according to the input combination.

16. The clock frequency divider method according to claim 10, wherein the communication timing signal is generated by detecting a rising edge timing of a clock signal input as a reference of a communication timing.

* * * * *